(12) United States Patent
Choi et al.

(10) Patent No.: US 10,917,990 B2
(45) Date of Patent: Feb. 9, 2021

(54) DISPLAY DEVICE

(71) Applicant: Samsung Display Co., Ltd., Yongin-Si (KR)

(72) Inventors: Sungchul Choi, Hwaseong-si (KR); Hansun Ryou, Seoul (KR); Dongjin Park, Seongnam-si (KR); Dongwoo Seo, Suwon-si (KR); Jaiku Shin, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/732,532

(22) Filed: Jan. 2, 2020

(65) Prior Publication Data
US 2020/0260603 A1 Aug. 13, 2020

(30) Foreign Application Priority Data
Feb. 8, 2019 (KR) .................... 10-2019-0014990

(51) Int. Cl.
| G06F 1/16 | (2006.01) |
| H05K 5/03 | (2006.01) |
| H05K 5/00 | (2006.01) |
| H01L 51/52 | (2006.01) |
| H01L 51/00 | (2006.01) |

(52) U.S. Cl.
CPC ........... *H05K 5/03* (2013.01); *H01L 51/5237* (2013.01); *H05K 5/0017* (2013.01); *H01L 51/0097* (2013.01)

(58) Field of Classification Search
CPC .................... H01L 51/0097; G06F 1/1652
USPC .................... 361/679.3, 679.55, 679.56
See application file for complete search history.

(56) References Cited

U.S. PATENT DOCUMENTS

| 2016/0035801 | A1 | 2/2016 | Kim | |
| 2016/0070303 | A1* | 3/2016 | Lee | G06F 1/1652 |
| | | | | 361/679.27 |
| 2016/0209874 | A1 | 7/2016 | Choi et al. | |
| 2018/0145269 | A1* | 5/2018 | Myeong | H01L 51/0097 |
| 2019/0357366 | A1 | 11/2019 | Choi et al. | |
| 2020/0137907 | A1* | 4/2020 | Kang | G06F 1/1681 |

FOREIGN PATENT DOCUMENTS

| CN | 110503895 A | 11/2019 |
| KR | 1020160016267 A | 2/2016 |
| KR | 1020160089583 A | 7/2016 |
| KR | 1020180036323 A | 4/2018 |

* cited by examiner

*Primary Examiner* — Anthony Q Edwards
(74) *Attorney, Agent, or Firm* — Cantor Colburn LLP

(57) ABSTRACT

A display device includes a display module including a first non-folding area, a folding area, and a second non-folding area sequentially defined along a first direction, and a cover member disposed under the display module. The cover member includes a first plate including a first support portion disposed under the first non-folding area and a first protrusion portion disposed under the folding area and a second plate including a second support portion disposed under the second non-folding area and a second protrusion portion disposed under the folding area. A thickness of the first protrusion portion is smaller than a thickness of the first support portion, and a thickness of the second protrusion portion is smaller than a thickness of the second support portion.

20 Claims, 18 Drawing Sheets

DISPLAY DEVICE

This application claims priority to Korean Patent Application No. 10-2019-0014990, filed on Feb. 8, 2019, and all the benefits accruing therefrom under 35 U.S.C. § 119, the content of which in its entirety is herein incorporated by reference.

BACKGROUND

1. Field

Exemplary embodiments of the invention relate to a display device having an improved reliability.

2. Description of the Related Art

A display device displays various images through a display screen to provide a user with information. In general, the display device displays the information in an allocated screen area. In recent years, a flexible display device including a flexible display panel that is capable of being folded has been developed. Differently from a rigid display device, the flexible display device is foldable, rollable, or bendable. The flexible display device, which is capable of being transformed into various shapes, is easy to carry, and thereby improves a user's convenience.

SUMMARY

Exemplary embodiments of the invention provide a display device having an improved reliability.

An exemplary embodiment of the invention provides a display device including a display module including a first non-folding area, a folding area, and a second non-folding area sequentially defined along a first direction and a cover member disposed under the display module. The cover member includes a first plate including a first support portion disposed under the first non-folding area and a first protrusion portion disposed under the folding area and a second plate including a second support portion disposed under the second non-folding area and a second protrusion portion disposed under the folding area. A thickness of the first protrusion portion is smaller than a thickness of the first support portion, and a thickness of the second protrusion portion is smaller than a thickness of the second support portion.

In an exemplary embodiment, the thickness of the first protrusion portion and the thickness of the second protrusion portion may be uniform.

In an exemplary embodiment, the thickness of the first protrusion portion may decrease as a distance from the first support portion increases, and the thickness of the second protrusion portion may decrease as a distance from the second support portion increases.

In an exemplary embodiment, an upper surface of the first protrusion portion and an upper surface of the second protrusion portion may have a curvature.

In an exemplary embodiment, an upper surface of the first support portion and an upper surface of the first protrusion portion may be disposed on a same plane, an upper surface of the second support portion and an upper surface of the second protrusion portion may be disposed on a same plane, and the upper surface of the first support portion and the upper surface of the first protrusion portion may face the display module.

In an exemplary embodiment, a lower surface of the first support portion and a lower surface of the first protrusion portion may be disposed on a same plane, and a lower surface of the second support portion and a lower surface of the second protrusion portion may be disposed on a same plane.

In an exemplary embodiment, the first support portion may include a first sub-support portion disposed under the display module, a sub-adhesive layer attached to a lower portion of the first sub-support portion, and a second sub-support portion attached to a lower portion of the sub-adhesive layer.

In an exemplary embodiment, the first protrusion portion may include a first sub-protrusion portion disposed under the display module and a second sub-protrusion portion spaced apart from the first sub-protrusion portion.

In an exemplary embodiment, the first sub-support portion and the first sub-protrusion portion may be unitary with each other, and the second sub-support portion and the second sub-protrusion portion may be unitary with each other.

In an exemplary embodiment, a thickness of the first sub-support portion may be smaller than a thickness of the second sub-support portion, and a thickness of the first sub-protrusion portion may be smaller than a thickness of the second sub-protrusion portion.

In an exemplary embodiment, the cover member may further include an adhesive layer disposed between the first plate and the display module and between the second plate and the display module, and the adhesive layer may be attached to the first support portion and the second support portion and separated from the first protrusion portion and the second protrusion portion.

In an exemplary embodiment, the cover member further may include a first coating layer disposed on the first protrusion portion and a second coating layer disposed on the second protrusion portion, and the first coating layer and the second coating layer may be separated from the adhesive layer.

In an exemplary embodiment, an adhesive force of a first portion of the adhesive layer, which faces the first protrusion portion and the second protrusion portion, may be lower than an adhesive force of a second portion of the adhesive layer, which faces the first support portion and the second support portion.

In an exemplary embodiment, at least one of the first plate and the second plate may be a metal plate.

In an exemplary embodiment, at least one of the first plate and the second plate may be a plastic plate.

An exemplary embodiment of the invention provides a display device including a display module that is transformable into a first state in which the display module is folded and into a second state in which the display module is unfolded and a cover member disposed under the display module. The cover member includes an adhesive layer, a first plate including a first support portion attached to a lower portion of the adhesive layer and a first protrusion portion extending from the first support portion, and a second plate including a second support portion disposed under the lower portion of the adhesive layer and a second protrusion portion extending from the second support portion. The first protrusion portion and the second protrusion portion are spaced apart from the adhesive layer in the first state, a thickness of the first protrusion portion is smaller than a thickness of the first support portion, and a thickness of the second protrusion portion is smaller than a thickness of the second support portion.

In an exemplary embodiment, the first protrusion portion and the second protrusion portion may respectively include concave lower surfaces respectively recessed from a lower surface of the first support portion and a lower surface of the second support portion.

In an exemplary embodiment, the first support portion may include a first sub-support portion disposed under the display module, a sub-adhesive layer attached to a lower portion of the first sub-support portion, and a second sub-support portion attached to a lower portion of the sub-adhesive layer. The first protrusion portion may include a first sub-protrusion portion extending from the first sub-support portion and a second sub-protrusion portion extending from the second sub-support portion. The first sub-protrusion portion and the second sub-protrusion portion may be spaced apart from each other.

In an exemplary embodiment, the first protrusion portion and the second protrusion portion may respectively include concave upper surfaces respectively recessed from an upper surface of the first support portion and an upper surface of the second support portion. The upper surface of the first support portion and the upper surface of the second support portion may be attached to the adhesive layer.

In an exemplary embodiment, the display module may include a first non-folding area, a folding area, and a second non-folding area, which are sequentially defined in the display module, and the first protrusion portion and the second protrusion portion overlap with the folding area in the second state.

According to the above, a deformation degree of the display module may be reduced. Thus, a degree of visibility of the flexural deformation may be reduced, and the reliability of the display device may be improved.

BRIEF DESCRIPTION OF THE DRAWINGS

The above and other advantages of the invention will become readily apparent by reference to the following detailed description when considered in conjunction with the accompanying drawings, in which.

DETAILED DESCRIPTION

Figure 1A:
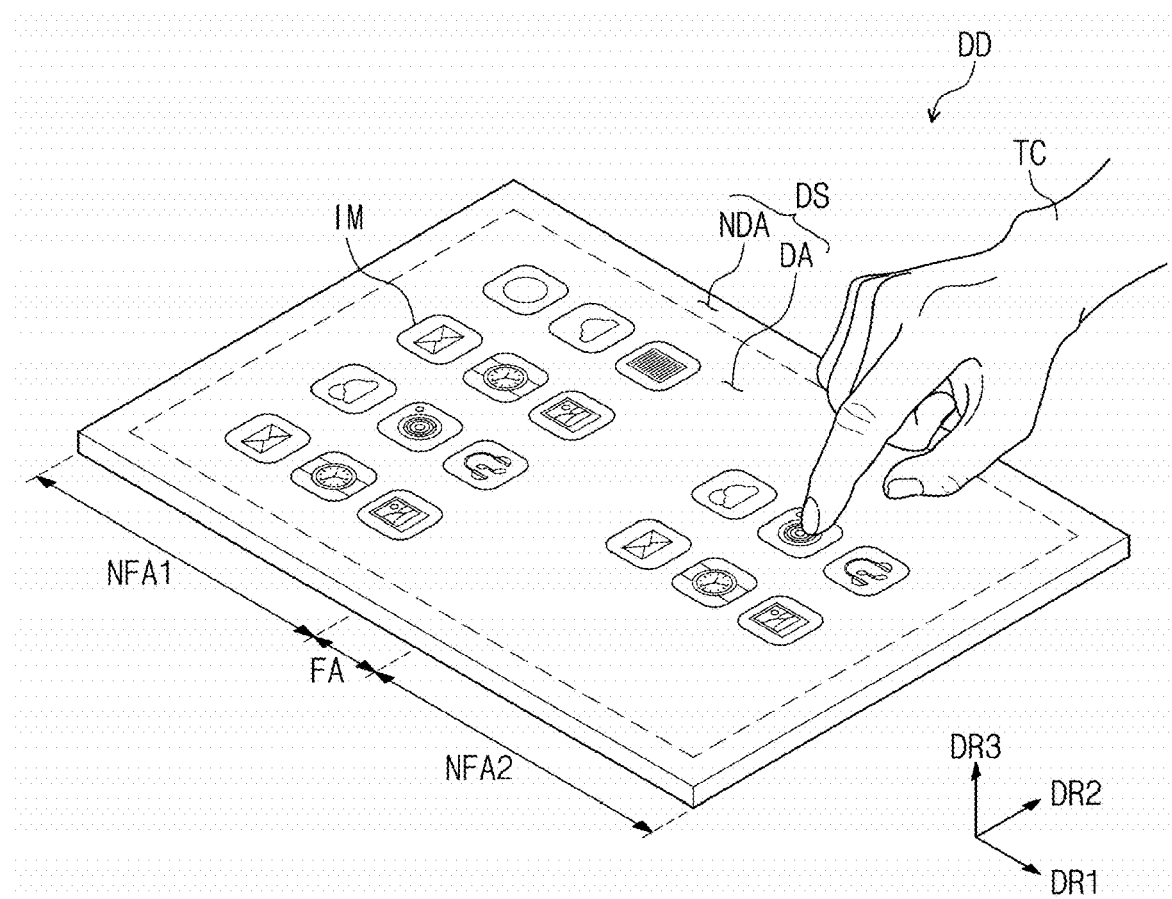
FIG. 1A is a perspective view showing an exemplary embodiment of a display device according to the invention.

It will be understood that when an element or layer is referred to as being "on", "connected to" or "coupled to" another element or layer, it may be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the drawing figures.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the invention will be explained in detail with reference to the accompanying drawings.

Figure 1B:
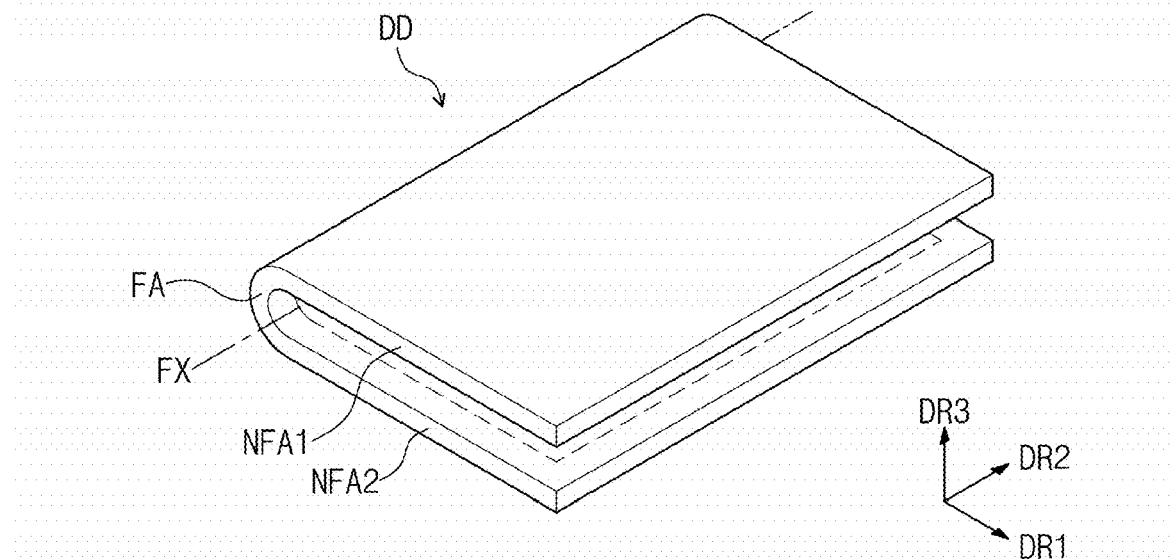
FIG. 1B is a perspective view showing a folded state of the display device shown in FIG. 1A.

FIG. 1A is a perspective view showing an exemplary embodiment of a display device DD according to the invention. FIG. 1B is a perspective view showing a folded state of the display device DD shown in FIG. 1A.

Referring to FIGS. 1A and 1B, the display device DD may be a foldable display device. The display device DD in the exemplary embodiment of the invention may be applied to a large-sized electronic item, such as a television set or a monitor, or a small and medium-sized item, such as a mobile phone, a tablet computer, a car navigation unit, a game unit, or a smart watch.

An upper surface of the display device DD may be defined as a display surface DS, and the display surface DS may have a plane surface defined by a first direction DR1 and a second direction DR2.

The display surface DS may include a display area DA and a non-display area NDA around the display area DA. An image IM is displayed through the display area DA and is not displayed through the non-display area NDA. FIG. 1A shows application icons as a representative example of the image IM. However, the invention is not limited thereto, and a number and a type of the icons may be variously changed.

The display area DA may have a quadrangular shape. The non-display area NDA may surround the display area DA, however, it should not be limited thereto or thereby. The shape of the display area DA and the shape of the non-display area NDA may be designed relative to each other.

The display device DD may include a first non-folding area NFA1, a folding area FA, and a second non-folding area NFA2, which are sequentially defined therein along the first direction DR1. That is, the folding area FA may be defined between the first non-folding area NFA1 and the second non-folding area NFA2. FIGS. 1A and 1B show one folding area FA and two non-folding areas, e.g., the first and second non-folding areas NFA1 and NFA2, however, the number of the folding areas and the non-folding areas should not be limited thereto or thereby. In an exemplary embodiment, the display device DD may include more than two non-folding areas and folding areas disposed between the non-folding areas, for example.

The display device DD may be folded with reference to a folding axis FX. That is, the folding area FA may be folded with reference to the folding axis FX. The folding axis FX may extend in the second direction DR2. The folding axis FX may be a short axis substantially parallel to short sides of the display device DD.

When the display device DD is folded, the display surface corresponding to the first non-folding area NFA1 and the display surface corresponding to the second non-folding area NFA2 may face each other. Accordingly, the display surface DS may not be exposed to the outside in the folded state.

Figure 2A:
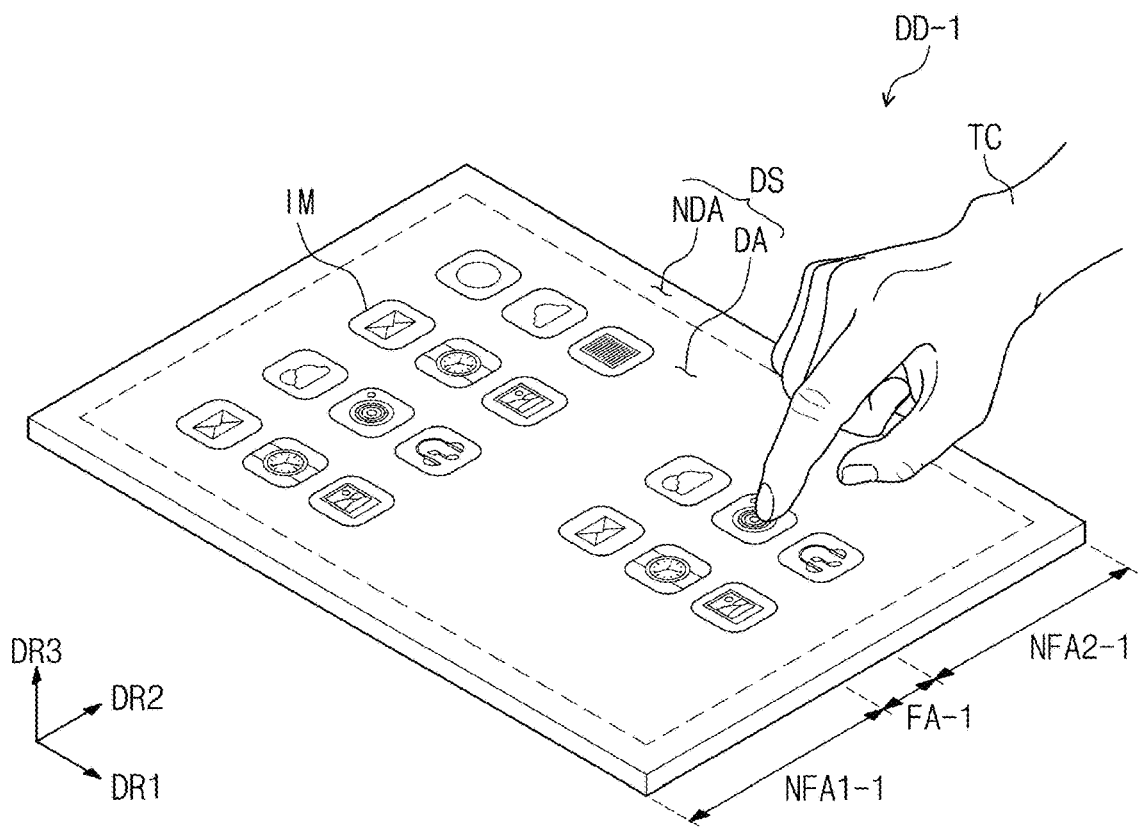
FIG. 2A is a perspective view showing an exemplary embodiment of a display device according to the invention.
Figure 2B:
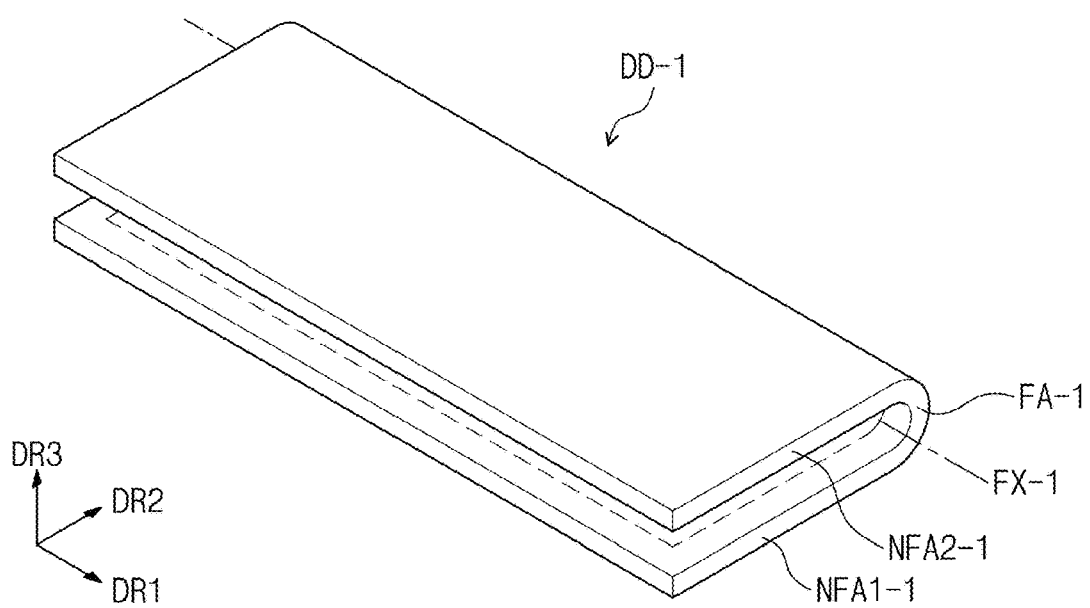
FIG. 2B is a perspective view showing a folded state of the display device shown in FIG. 2A.

FIG. 2A is a perspective view showing an exemplary embodiment of a display device DD-1 according to the invention. FIG. 2B is a perspective view showing a folded state of the display device DD-1 shown in FIG. 2A.

Referring to FIGS. 2A and 2B, the display device DD-1 may include a first non-folding area NFA1-1, a folding area FA-1, and a second non-folding area NFA2-1, which are sequentially defined therein along the second direction DR2. That is, the folding area FA-1 may be defined between the first non-folding area NFA1-1 and the second non-folding area NFA2-1.

The display device DD-1 may be folded with reference to a folding axis FX-1. That is, the folding area FA-1 may be folded with reference to the folding axis FX-1. The folding axis FX-1 may extend in the first direction DR1. The folding axis FX-1 may be a long axis substantially parallel to long sides of the display device DD-1.

Hereinafter, a structure of the display device DD folded with reference to the short axis will be described in detail, however, structures described later may be applied to the display device DD-1 folded with reference to the long axis.

Figure 3:
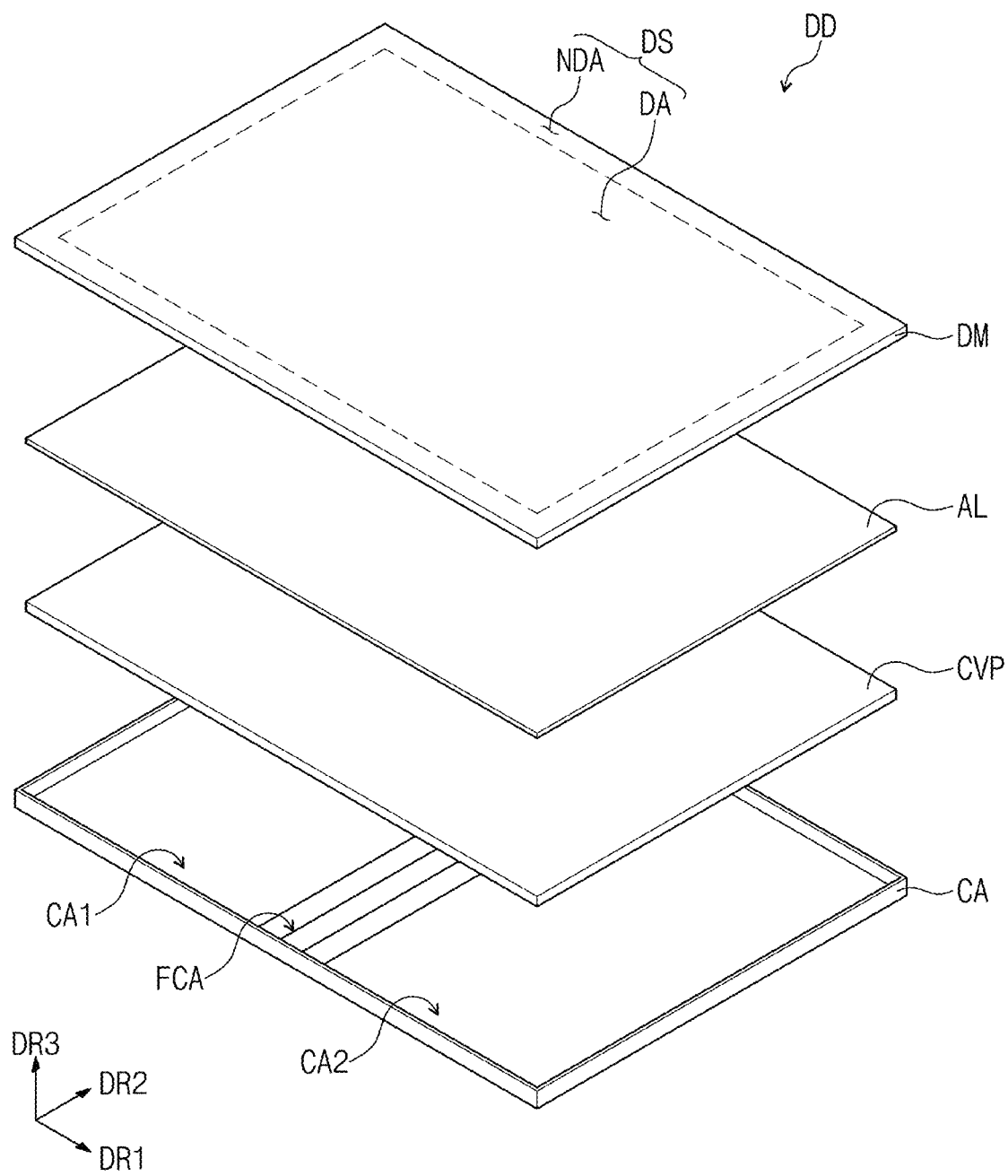
FIG. 3 is an exploded perspective plan view showing an exemplary embodiment of a display device according to the invention.

FIG. 3 is an exploded perspective plan view showing an exemplary embodiment of a display device DD according to the invention.

Referring to FIG. 3, the display device DD may include a display module DM, an adhesive layer AL, a cover member CVP, and a case member CA.

The display module DM may display the image IM (refer to FIG. 1A) and may sense an external input TC (refer to FIG. 1A). The external input TC may be a user input. In an exemplary embodiment, the user input may include various types of external inputs, such as a part of the user's body, light, heat, or pressure. In FIG. 1A, the external input TC is shown as a user's hand being applied to the display surface DS, however, this is merely exemplary. As described above, the external input TC may be provided in various forms. In addition, the display device DD may sense the external input TC applied to a side or rear surface of the display device DD depending on its structure, however, it should not be limited to a specific embodiment.

The cover member CVP may be disposed under the display module DM. The cover member CVP may support a rear surface of the display module DM and may protect the display module DM. The cover member CVP will be described in detail later.

The adhesive layer AL may be disposed between the display module DM and the cover member CVP. The display module DM and the cover member CVP may be coupled to each other by the adhesive layer AL. The adhesive layer AL may include an adhesive or a pressure sensitive adhesive ("PSA"). In another exemplary embodiment of the invention, the adhesive layer AL may be omitted.

The case member CA may be disposed at an outermost position of the display device DD and accommodate components therein. The case member CA may include a bottom portion and a sidewall extending from the bottom portion. In addition, the display module DM, the adhesive layer AL, the cover member CVP, and electronic modules (not shown) may be accommodated in an inner space defined by the bottom portion and the sidewall of the case member CA. In an exemplary embodiment, the electronic modules may include, for example, a camera, a flash, a fingerprint sensor, a battery, and a functional sensor, and the functional sensor may be a proximity sensor, a color density detection sensor, an illuminance sensor, a motion sensor, or a heart rate sensor. However, this is merely exemplary, and the functional sensor should not be limited thereto or thereby. In addition, in another exemplary embodiment, some of the camera, the flash, the fingerprint sensor, the battery, and the functional sensor may be omitted, and other electronic modules may be further used.

The case member CA may include a material having a relatively high strength as compared with the display module DM. In an exemplary embodiment, the case member CA may include a plurality of frames and/or plates including a glass, plastic, or metal material, or combinations thereof, for example. The case member CA may stably protect the components of the display device DD, which are accommodated in the inner space, from external impacts.

In addition, the case member CA may include a first case portion CA1, a second case portion CA2, and a folding case portion FCA. The folding case portion FCA may be disposed between the first case portion CA1 and the second case portion CA2. The folding case portion FCA may have a hinge structure or may include a flexible material.

FIGS. 4A to 4F are cross-sectional views showing an exemplary embodiment of display modules DM-1, DM-2, DM-3, DM-4, DM-5, and DM-6 according to the invention. FIGS. 4A to 4F simply show the display modules DM-1, DM-2, DM-3, DM-4, DM-5, and DM-6 to explain a stacked relation between a functional panel and/or functional units of the display modules DM-1, DM-2, DM-3, DM-4, DM-5, and DM-6.

FIGS. 4A to 4F show a cross-section defined by the first direction DR1 and a third direction DR3. The third direction DR3 may be a direction perpendicular to the plane surface defined by the first direction DR1 and the second direction DR2. In the following descriptions, the expression "in a plan view" or "on a plan view" may mean a state of being viewed in the third direction DR3.

The display module DM (refer to FIG. 3) in the exemplary embodiment of the invention may include a display panel, an input sensing unit, an anti-reflection unit, and a window unit. At least some components among the display panel, the input sensing unit, the anti-reflection unit, and the window unit may be provided through consecutive processes or at least some components among the display panel, the input sensing unit, the anti-reflection unit, and the window unit may be coupled to each other by an adhesive member. The display module DM may be one of the display modules DM-1, DM-2, DM-3, DM-4, DM-5, and DM-6 respectively shown in FIGS. 4A to 4F.

FIGS. 4A to 4F show an optical clear adhesive ("OCA") member as a representative example of the adhesive member. The adhesive member described hereinafter may include an adhesive or a PSA. In the exemplary embodiment, the anti-reflection unit and the window unit may be replaced with other components or may be omitted.

In FIGS. 4A to 4F, among the input sensing unit, the anti-reflection unit, and the window unit, a component provided through continuous processes with another component is expressed as "layer". Among the input sensing unit, the anti-reflection unit, and the window unit, a component coupled to another component by an adhesive member is expressed as "panel". The panel includes a base layer that provides a base surface, e.g., a synthetic resin film, a composite material film, or a glass substrate, however, in the case of the "layer", the base layer may be omitted. In other words, the units expressed as the "layer" are disposed on the base surface provided by other units.

The input sensing unit, the anti-reflection unit, and the window unit may be also referred to as an input sensing panel ISP, an anti-reflection panel RPP, and a window panel WP, respectively, or an input sensing layer ISL, an anti-reflection layer RPL, and a window layer WL, respectively.

Figure 4A:
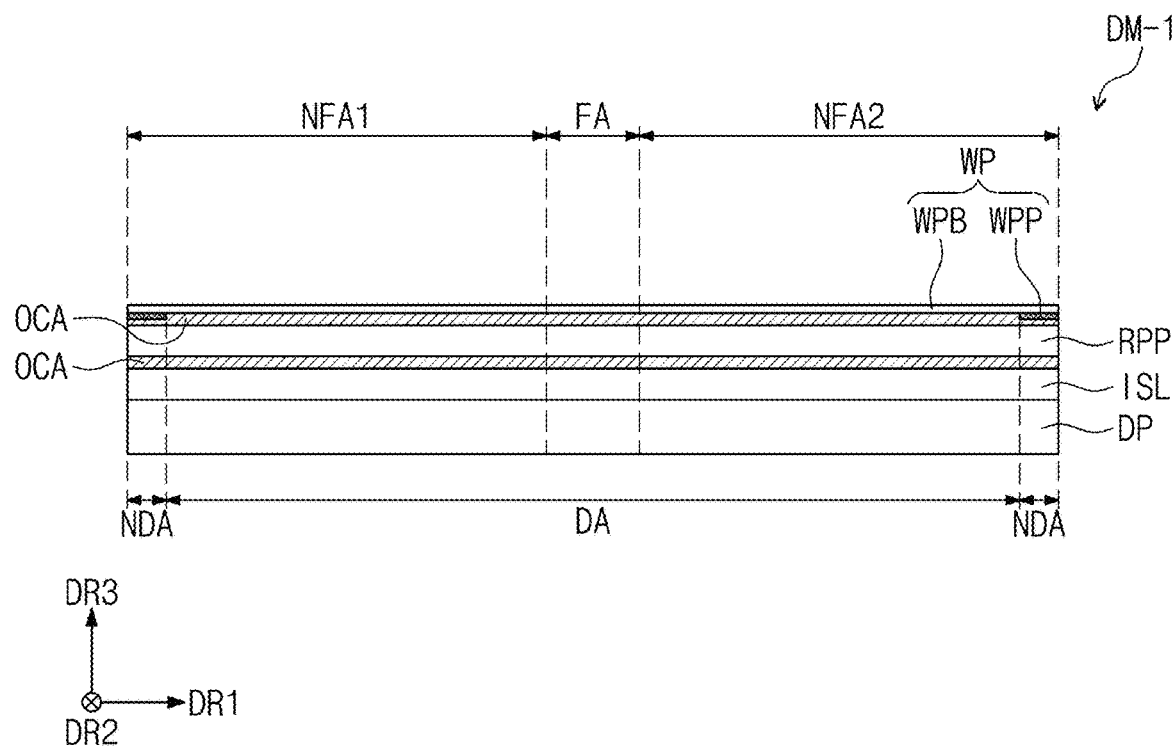
FIGS. 4A to 4F are cross-sectional views showing an exemplary embodiment of display modules according to the invention.

Referring to FIG. 4A, a display module DM-1 may include a display panel DP, an input sensing layer ISL, an anti-reflection panel RPP, and a window panel WP. The input sensing layer ISL is directly disposed on the display panel DP. In the following descriptions, the expression that a component "B" is directly disposed on a component "A" means that no intervening elements, such as an adhesive layer/an adhesive member, are between the component "B" and the component "A". The component "B" is provided on a base surface provided by the component "A" through continuous processes after the component "A" is provided.

The OCA member is disposed between the input sensing layer ISL and the anti-reflection panel RPP and between the anti-reflection panel RPP and the window panel WP.

The display panel DP generates an image, and the input sensing layer ISL obtains coordinate information on an external input, for example, a touch event.

The display panel DP in an exemplary embodiment of the invention may be a light emitting type display panel, however, it should not be particularly limited. In an exemplary embodiment, the display panel DP may be an organic light emitting display panel or a quantum dot light emitting display panel, for example. A light emitting layer of the organic light emitting display panel may include an organic light emitting material. A light emitting layer of the quantum dot light emitting display panel may include a quantum dot or a quantum rod. Hereinafter, the organic light emitting display panel will be described as a representative example of the display panel DP.

The input sensing layer ISL may include a plurality of insulating layers and a plurality of conductive layers. The conductive layers may form a sensing electrode sensing the external input, a sensing line connected to the sensing electrode, and a sensing pad connected to the sensing line. The input sensing layer ISL may sense the external input by a mutual capacitance method and/or a self-capacitance method, however, the input sensing method should not be limited thereto or thereby.

The anti-reflection panel RPP reduces a reflectance of an external light incident thereto from the above of the window panel WP. The anti-reflection panel RPP in the exemplary embodiment of the invention may include a retarder and a polarizer. In an exemplary embodiment, the retarder may be a film type or liquid crystal coating type and may include a $\lambda/2$ retarder and/or a $\lambda/4$ retarder, for example. In an exemplary embodiment, the polarizer may be a film type or liquid crystal coating type, for example. In an exemplary embodiment, the film type polarizer may include a stretching type synthetic resin film, and the liquid crystal coating type polarizer may include liquid crystals aligned in a predetermined alignment. In an exemplary embodiment, the retarder and the polarizer may further include a protective film. The retarder and the polarizer or the protective film may be defined as a base layer of the anti-reflection panel RPP.

The anti-reflection panel RPP in the exemplary embodiment of the invention may include color filters. The color filters may have a predetermined alignment. The alignment of the color filters may be determined by taking into account light emitting colors of the pixels included in the display panel DP. The anti-reflection panel RPP may further include a black matrix disposed adjacent to the color filters.

The anti-reflection panel RPP in the exemplary embodiment of the invention may include a destructive interference structure. In an exemplary embodiment, the destructive interference structure may include a first reflection layer and a second reflection layer, which are disposed on different layers from each other, for example. A first reflection light and a second reflection light, which are respectively reflected by the first reflection layer and the second reflection layer, may interfere destructively with each other, and thus the reflectance of the external light may be reduced.

The window panel WP in the exemplary embodiment of the invention includes a base film WPB and a light blocking pattern WPP. In an exemplary embodiment, the base film WPB includes a glass substrate and/or a synthetic resin film, for example. The base film WPB should not be limited to a single-layer structure. The base film WPB may include two or more films coupled to each other by an adhesive member.

The light blocking pattern WPP partially overlaps with the base film WPB. The light blocking pattern WPP is disposed on a rear surface of the base film WPB to define a bezel area of the display device DD, i.e., a non-display area NDA.

The light blocking pattern WPP may be a colored organic layer and may be provided by a coating method. Although not shown in drawing figures, the window panel WP may further include a functional coating layer disposed on an entire surface of the base film WPB. In an exemplary embodiment, the functional coating layer may include an anti-fingerprint layer, an anti-reflection layer, and a hard coating layer. In FIGS. 4B to 4F, the window panel WP and the window layer WL are briefly shown without distinguishing the base film WPB and the light blocking pattern WPP.

Figure 4B:
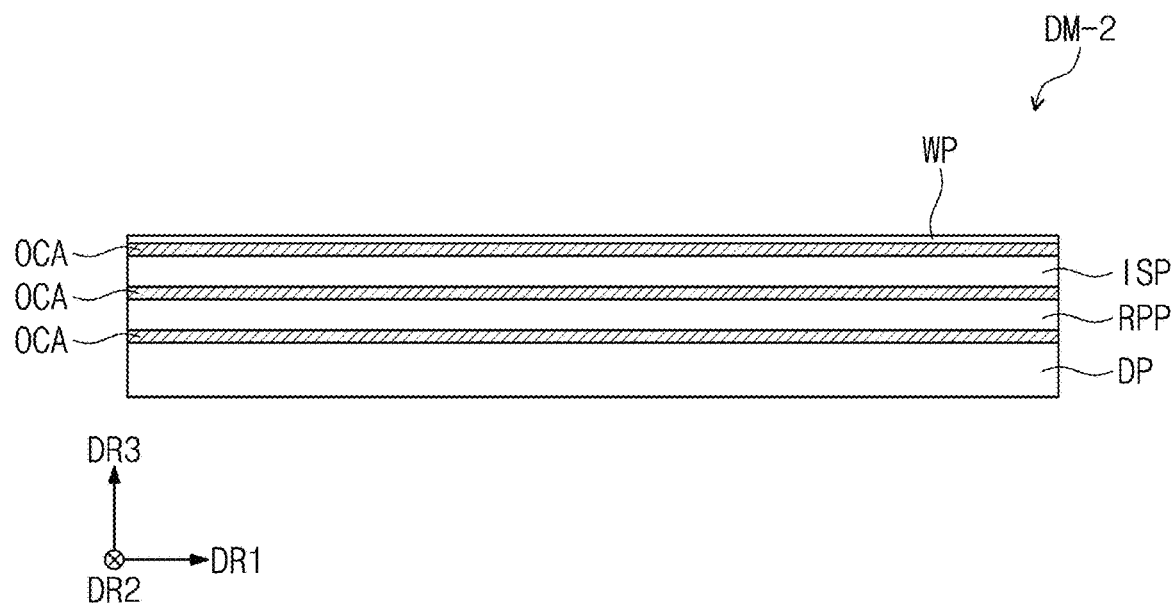
Figure 4C:
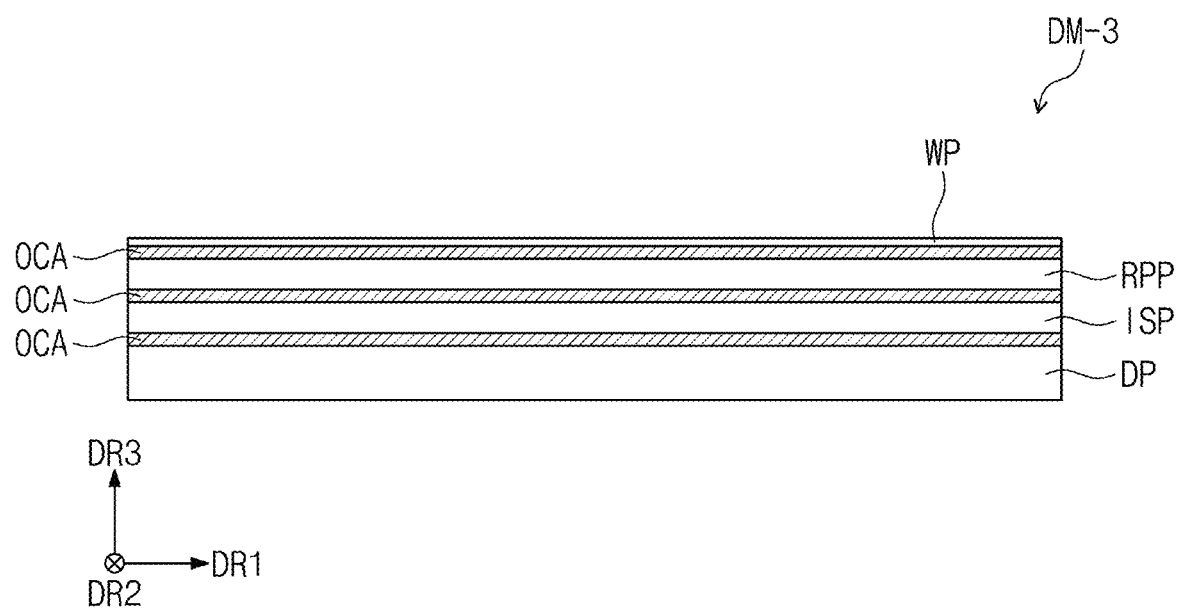

Referring to FIGS. 4B and 4C, each of the display modules DM-2 and DM-3 may include a display panel DP, an input sensing panel ISP, an anti-reflection panel RPP, and a window panel WP. A stacking order of the input sensing panel ISP and the anti-reflection panel RPP of the display module DM-2 may be different from a stacking order of the input sensing panel ISP and the anti-reflection panel RPP of the display module DM-3.

Figure 4D:
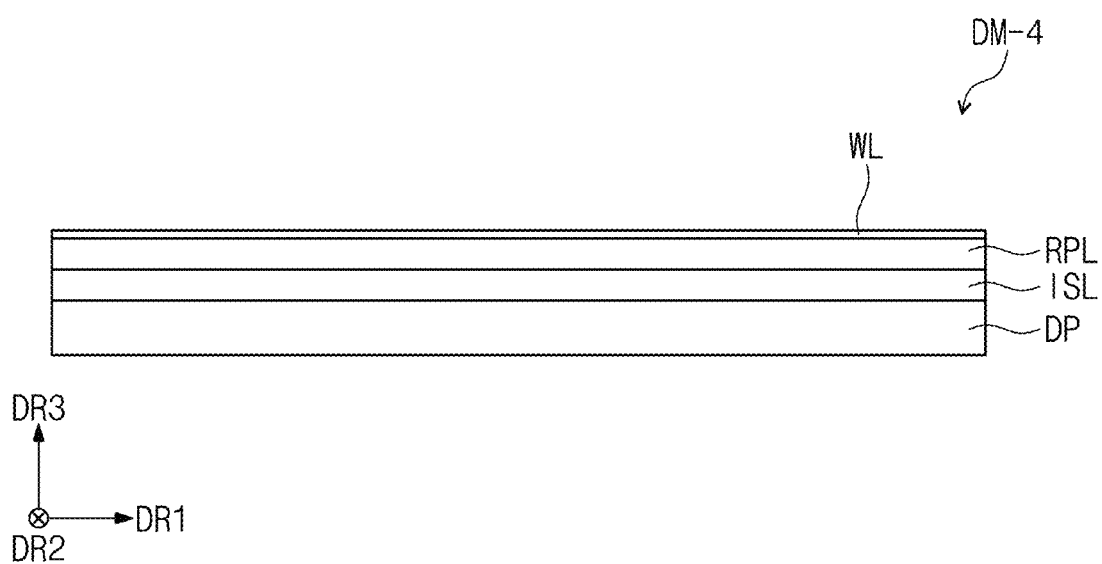

Referring to FIG. 4D, the display module DM-4 may include a display panel DP, an input sensing layer ISL, an anti-reflection layer RPL, and a window layer WL. The input sensing layer ISL, the anti-reflection layer RPL, and the window layer WL may be disposed on a base surface of the display panel DP through continuous processes. A stacking order of the input sensing layer ISL and the anti-reflection layer RPL may be changed.

Figure 4E:
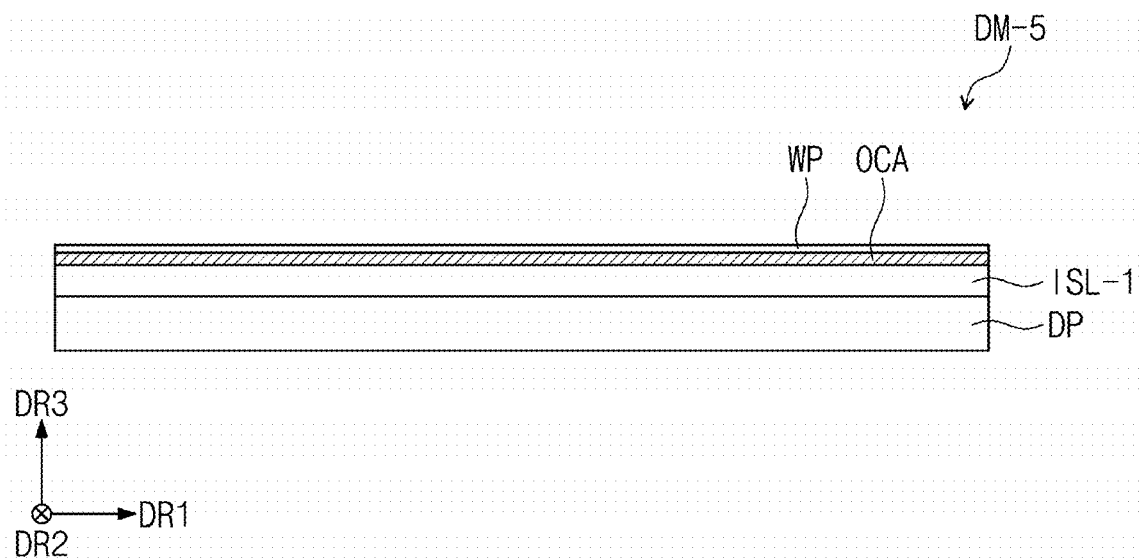
Figure 4F:
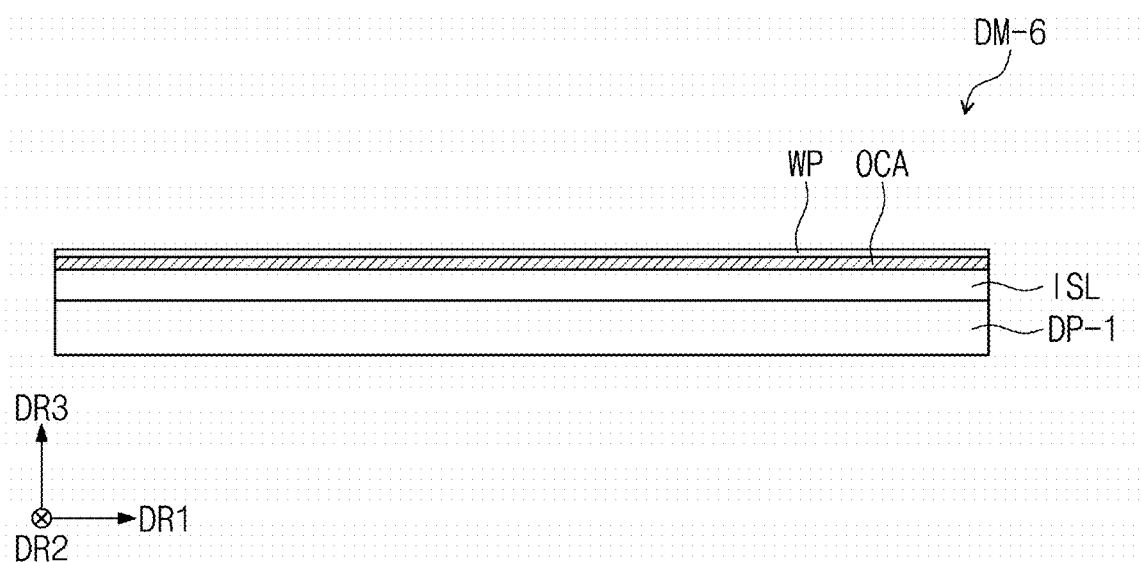

Referring to FIGS. 4E and 4F, each of the display modules DM-5 and DM-6 may not include an anti-reflection unit.

As shown in FIG. 4E, the display module DM-5 may include a display panel DP, an input sensing layer ISL-1, and a window panel WP. Different from the input sensing panel ISP or the input sensing layer ISL shown in FIGS. 4A to 4D, the input sensing layer ISL-1 according to the illustrated exemplary embodiment may further have an anti-reflection function.

As shown in FIG. 4F, the display module DM-6 may include a display panel DP-1, an input sensing layer ISL, and a window panel WP. Different from the display panel DP shown in FIGS. 4A to 4E, the display panel DP-1 according to the illustrated exemplary embodiment may further have an anti-reflection function.

In an exemplary embodiment, each of the input sensing layer ISL-1 and the display panel DP-1 may further include a functional layer having the anti-reflection function, for example. The functional layer may be color filters having a predetermined alignment or a destructive interference structure having a stacked structure with different refractive indices, however, it should not be limited thereto or thereby.

Figure 5:
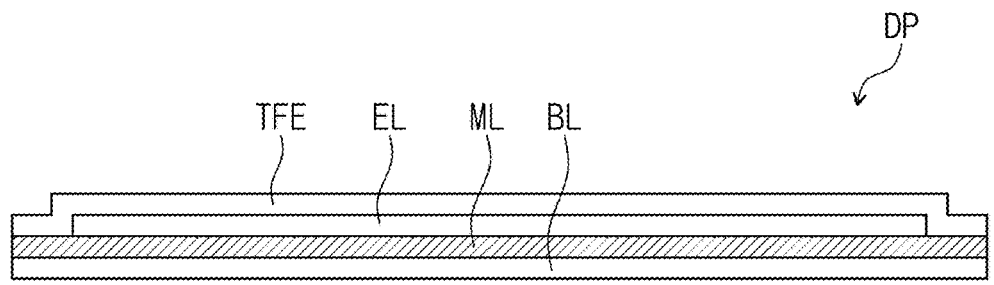
FIG. 5 is a cross-sectional view showing an exemplary embodiment of a display panel according to the invention.

FIG. 5 is a cross-sectional view showing an exemplary embodiment of a display panel according to the invention.

Referring to FIG. 5, the display panel DP may include a base layer BL, a circuit layer ML, a light emitting element layer EL, and a thin film encapsulation layer TFE.

The base layer BL may include a flexible material. In an exemplary embodiment, the base layer BL may be a plastic substrate. In an exemplary embodiment, the plastic substrate may include at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin, for example. As an example, the base layer BL may include a single-layer structure of the polyimide-based resin, however, it should not be limited thereto or thereby. That is, the base layer BL may be a stacked structure including a plurality of insulating layers.

The circuit layer ML may be disposed on the base layer BL. The circuit layer ML may include a plurality of insulating layers, a plurality of conductive layers, and a semiconductor layer.

The light emitting element layer EL may be disposed on the circuit layer ML. The light emitting element layer EL may include a display element, e.g., organic light emitting diodes.

The thin film encapsulation layer TFE may encapsulate the light emitting element layer EL. The thin film encapsulation layer TFE may include a plurality of inorganic layers and at least one organic layer disposed between the inorganic layers.

Figure 6:
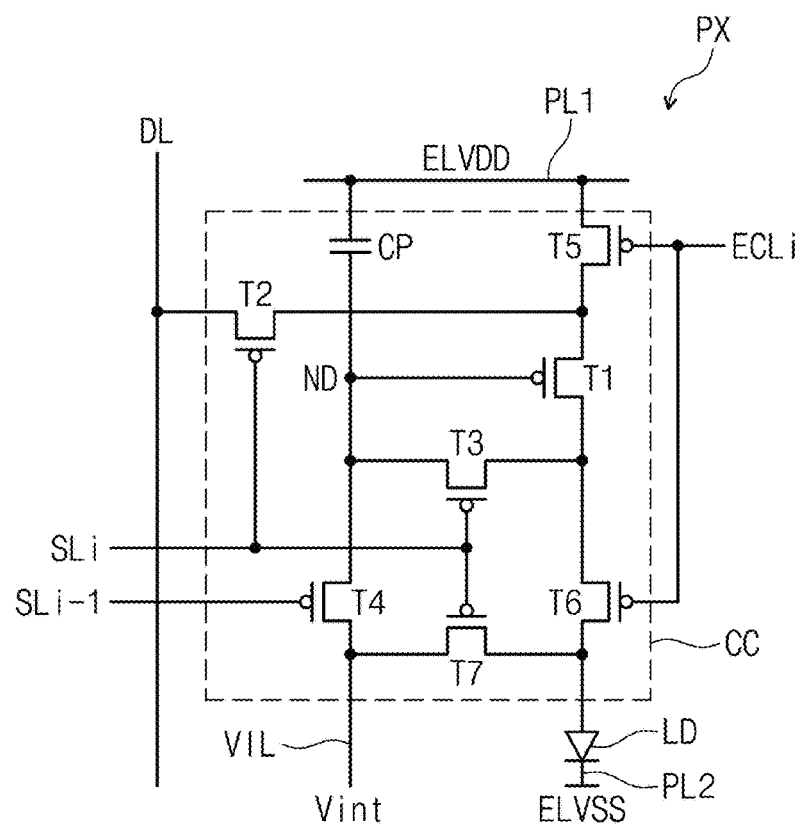
FIG. 6 is an equivalent circuit diagram showing an exemplary embodiment of a pixel according to the invention.

FIG. 6 is an equivalent circuit diagram showing an exemplary embodiment of a pixel PX according to the invention.

Referring to FIG. 6, the pixel PX is disposed in the display area DA (refer to FIG. 1A) and displays the image.

The pixel PX may be electrically connected to a plurality of signal lines. FIG. 6 shows scan lines SLi and SLi−1, a data line DL, a first power line PL1, a second power line PL2, an initialization power line VIL, and a light emitting control line ECLi among the signal lines where i is a natural number greater than one, however, they are merely exemplary. The pixel PX in another exemplary embodiment of the invention may be further connected to various signal lines, and some of the signal lines shown in FIG. 6 may be omitted.

The pixel PX may include a light emitting element LD and a pixel circuit CC. The light emitting element LD may be included in the light emitting element layer EL of FIG. 5, and the pixel circuit CC may be included in the circuit layer ML of FIG. 5.

The pixel circuit CC may include a plurality of transistors T1 to T7 and a capacitor CP. The pixel circuit CC may control an amount of current flowing through the light emitting element LD in response to a data signal.

The light emitting element LD may emit a light at a predetermined luminance in response to the amount of current provided from the pixel circuit CC. To this end, a level of a first power ELVDD may be set higher than a level of a second power ELVSS.

Each of the transistors T1 to T7 may include an input electrode (or source electrode), an output electrode (or drain electrode), and a control electrode (or gate electrode). In the following descriptions, for the convenience of explanation, one electrode of the input electrode and the output electrode may be also referred to as a "first electrode", and the other electrode of the input electrode and the output electrode may be also referred to as a "second electrode".

A first electrode of a first transistor T1 is connected to the first power line PL1 via a fifth transistor T5. The first power line PL1 may be a line to which the first power ELVDD is applied. A second electrode of the first transistor T1 is connected to an anode electrode of the light emitting element LD via a sixth transistor T6. The first transistor T1 may be also referred to as a "driving transistor" in the disclosure.

The first transistor T1 controls the amount of current flowing through the light emitting element LD in response to a voltage applied to a control electrode of the first transistor T1.

A second transistor T2 is connected between the data line DL and the first electrode of the first transistor T1. A control electrode of the second transistor T2 is connected to an i-th scan line SLi. The second transistor T2 is turned on when an i-th scan signal is applied to the i-th scan line SLi and electrically connects the data line DL to the first electrode of the first transistor T1.

A third transistor T3 is connected between the second electrode of the first transistor T1 and the control electrode of the first transistor T1. A control electrode of the third transistor T3 is connected to the i-th scan line SLi. The third transistor T3 is turned on when the i-th scan signal is applied to the i-th scan line SLi and electrically connects the second electrode of the first transistor T1 to the control electrode of the first transistor T1. Accordingly, when the third transistor T3 is turned on, the first transistor T1 is connected in a diode configuration.

A fourth transistor T4 is connected between a node ND and the initialization power line VIL. A control electrode of the fourth transistor T4 is connected to an (i−1)th scan line SLi−1. The node ND may be a node at which the fourth transistor T4 is connected to the control electrode of the first transistor T1. The fourth transistor T4 is turned on when an (i−1)th scan signal is applied to the (i−1)th scan line SLi−1 and provides an initialization voltage Vint to the node ND.

The fifth transistor T5 is connected between the first power line PL1 and the first electrode of the first transistor T1. The sixth transistor T6 is connected between the second electrode of the first transistor T1 and the anode electrode of the light emitting element LD. A control electrode of the fifth transistor T5 and a control electrode of the sixth transistor T6 are connected to an i-th light emitting control line ECLi.

A seventh transistor T7 is connected between the initialization power line VIL and the anode electrode of the light emitting element LD. A control electrode of the seventh transistor T7 is connected to the i-th scan line SLi. The seventh transistor T7 is turned on when the i-th scan signal is applied to the i-th scan line SLi and provides the initialization voltage Vint to the anode electrode of the light emitting element LD.

The seventh transistor T7 may improve a black expression ability of the pixel PX. In detail, when the seventh transistor T7 is turned on, a parasitic capacitance (not shown) of the light emitting element LD is discharged. Accordingly, when implementing a black luminance, the light emitting element LD does not emit the light due to a leakage current from the first transistor T1, and thus the black expression ability may be improved.

Additionally, in FIG. 6, the control electrode of the seventh transistor T7 is connected to the i-th scan line SLi, however, it should not be limited thereto or thereby. According to another exemplary embodiment, the control electrode of the seventh transistor T7 may be connected to the (i−1)th scan line SLi−1 or an (i+1)th scan line (not shown).

FIG. 6 illustrates a P-type metal-oxide-semiconductor ("MOS") as a reference of the pixel circuit CC, however, it should not be limited thereto or thereby. According to another exemplary embodiment, the pixel circuit CC may be implemented by an N-type metal-oxide-semiconductor ("NMOS"). According to another exemplary embodiment, the pixel circuit CC may be implemented by a combination of the NMOS and the PMOS.

The capacitor CP is disposed between the first power line PL1 and the node ND. The capacitor CP is charged with a voltage corresponding to the data signal. When the fifth and sixth transistors T5 and T6 are turned on due to the voltage charged in the capacitor CP, the amount of the current flowing through the first transistor T1 may be determined.

The light emitting element LD may be electrically connected to the sixth transistor T6 and the second power line PL2. The light emitting element LD may receive the second power ELVSS via the second power line PL2.

The light emitting element LD may emit the light at the voltage corresponding to a difference between the signal provided through the sixth transistor T6 and the second power ELVSS provided through the second power line PL2.

In the disclosure, the structure of the pixel PX should not be limited the structure shown in FIG. 6. According to another exemplary embodiment of the invention, the pixel PX may be implemented in various ways to allow the light emitting element LD to emit the light.

Figure 7A:
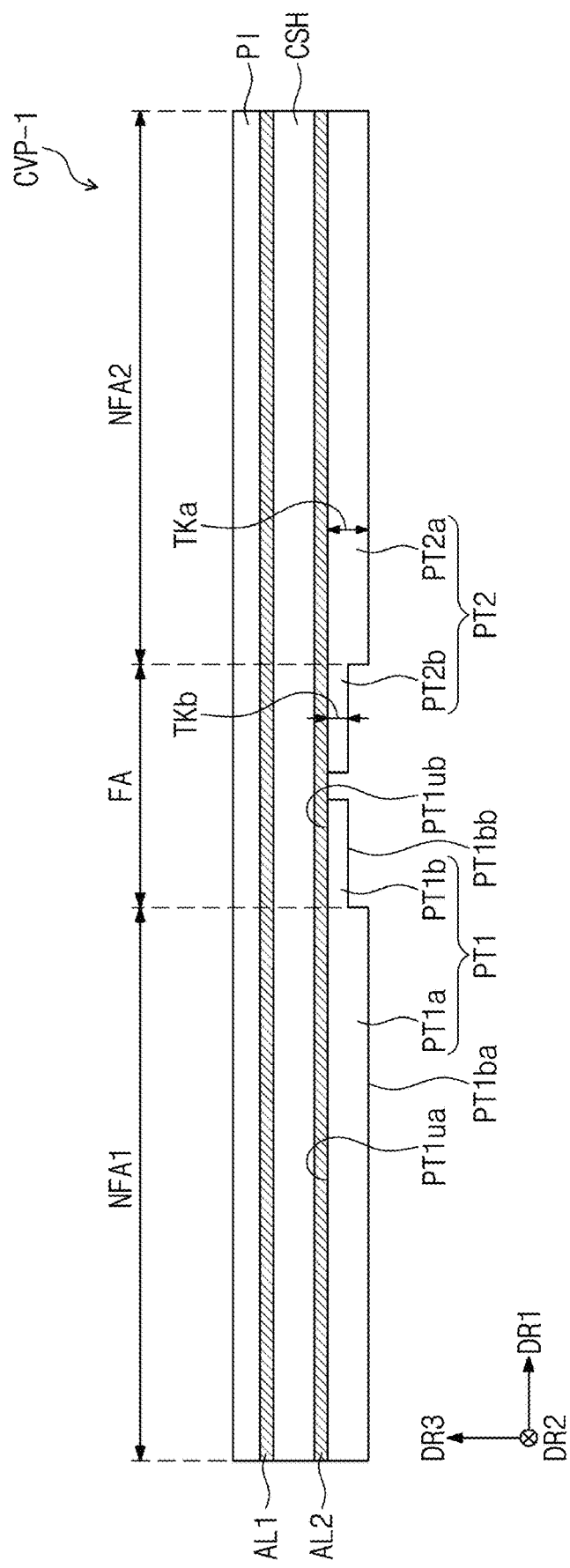
FIGS. 7A to 7E are cross-sectional views showing an exemplary embodiment of cover members according to the invention.

FIG. 7A is a cross-sectional view showing an exemplary embodiment of a cover member CVP-1 according to the invention.

Referring to FIG. 7A, the cover member CVP-1 may include a protective layer PI, a cushion layer CSH, a first plate PT1, a second plate PT2, a first adhesive layer AL1 and a second adhesive layer AL2.

The protective layer PI may be disposed under the display module DM (refer to FIG. 3). The protective layer PI may protect a rear surface of the display module DM. The protective layer PI may be a flexible plastic film. In an exemplary embodiment, the protective layer PI may be a polyimide film or a polyethylene terephthalate film, for example, however, this is merely exemplary, and the protective layer PI should not be limited thereto or thereby.

The first adhesive layer AL1 may be disposed under the protective layer PI and may be attached to a rear surface of the protective layer PI.

The cushion layer CSH may be disposed under the first adhesive layer AL1 and may be attached to a rear surface of the first adhesive layer AL1. In an exemplary embodiment, the cushion layer CSH may include a sponge, a foam, or a urethane resin, for example.

The second adhesive layer AL2 may be disposed under the cushion layer CSH and may be attached to a rear surface of the cushion layer CSH.

The first adhesive layer AL1 and the second adhesive layer AL2 may be optically transparent, semi-transparent, or opaque. The first adhesive layer AL1 and the second adhesive layer AL2 may an adhesive layer manufactured by coating a liquid adhesive material and curing the liquid adhesive material or an adhesive sheet separately manufactured. In an exemplary embodiment, the first adhesive layer AL1 and the second adhesive layer AL2 may be a PSA, an OCA, or an optical clear resin ("OCR"), for example.

The first plate PT1 and the second plate PT2 may be disposed under the second adhesive layer AL2. The first plate PT1 and the second plate PT2 may be separated from each other with respect to the folding axis FX (refer to FIG. 1B). In the exemplary embodiment of the invention, when two folding axes FX are provided, the number of the plates may be three.

The first plate PT1 and the second plate PT2 may be a metal plate or a plastic plate. In an exemplary embodiment, the first plate PT1 and the second plate PT2 may include a stainless steel, aluminum, or an alloy thereof, for example.

The first plate PT1 and the second plate PT2 may have a strength greater than a strength of the display module DM (refer to FIG. 3).

The first plate PT1 may include a first support portion PT1a and a first protrusion portion PT1b. The second plate PT2 may include a second support portion PT2a and a second protrusion portion PT2b. The first protrusion portion PT1b may protrude toward the second support portion PT2a from the first support portion PT1a, and the second protrusion portion PT2b may protrude toward the first support portion PT1a from the second support portion PT2a. The first support portion PT1a and the first protrusion portion PT1b may be unitary, and the second support portion PT2a and the second protrusion portion PT2b may be unitary.

In a plan view, the first support portion PT1a may overlap with the first non-folding area NFA1, the second support portion PT2a may overlap with the second non-folding area NFA2, and the first and second protrusion portions PT1b and PT2b may overlap with the folding area FA. The first support portion PT1a may be attached to the second adhesive layer AL2, and the second support portion PT2a may be attached to the second adhesive layer AL2.

The first support portion PT1a and the second support portion PT2a may have a first thickness TKa. The first protrusion portion PT1b and the second protrusion portion PT2b may have a second thickness TKb. The second thickness TKb may be smaller than the first thickness TKa. In an exemplary embodiment, the first thickness TKa may be about 150 micrometers, and the second thickness TKb may be about 10 micrometers, for example. However, these are merely exemplary, and the first thickness TKa and the second thickness TKb should not be limited thereto or thereby.

Each of the first support portion PT1a, the first protrusion portion PT1b, the second support portion PT2a, and the second protrusion portion PT2b may have a plate shape. Accordingly, each of the first support portion PT1a, the first protrusion portion PT1b, the second support portion PT2a, and the second protrusion portion PT2b may have a uniform thickness.

The first support portion PT1a includes an upper surface PT1ua and a lower surface PT1ba, the upper surface PT1ua faces the display module DM (refer to FIG. 3), and the lower surface PT1ba is spaced apart from the display module DM with the upper surface PT1ua interposed therebetween. The first protrusion portion PT1b includes an upper surface PT1ub and a lower surface PT1bb, the upper surface PT1ub faces the display module DM, and the lower surface PT1bb is spaced apart from the display module DM with the upper surface PT1ub interposed therebetween.

The upper surface PT1ua of the first support portion PT1a and the upper surface PT1ub of the first protrusion portion PT1b may be disposed on the same plane. When the display module DM (refer to FIG. 3) is in an unfolded state, the first protrusion portion PT1b and the second protrusion portion PT2b may support the folding area FA of the display module DM. The lower surface PT1bb of the first protrusion portion PT1b may be a concave surface recessed from the lower surface PT1ba of the first support portion PT1a. Accordingly, the lower surface PT1bb of the first protrusion portion PT1b and the lower surface PT1ba of the first support portion PT1a may be disposed on different planes from each other.

Each of the first protrusion portion PT1b and the second protrusion portion PT2b may have a cantilever structure. That is, one end of the first protrusion portion PT1b may be fixed to the first support portion PT1a, and one end of the second protrusion portion PT2b may be fixed to the second support portion PT2a. The first protrusion portion PT1b and the second protrusion portion PT2b may be easily deformed in shape.

When the folding and unfolding operations are repeated and the display device DD (refer to FIG. 1B) is in the folded state for a long time, a flexural deformation may occur in the foldable display device. When a portion of the upper surface of the display module DM protrudes due to the flexural deformation, the protruding portion may be easily recognized by the user. In the exemplary embodiment of the invention, when the flexural deformation occurs in the display module DM, the shape of the first protrusion portion PT1b and the second protrusion portion PT2b may be deformed due to the deformation of the display module DM. When a space in which the portion of the display module DM may be sagged is provided, a degree of protrusion of the display module DM may be reduced. Accordingly, the flexural deformation of the display module DM may be prevented from being recognized by the user.

Figure 7B:
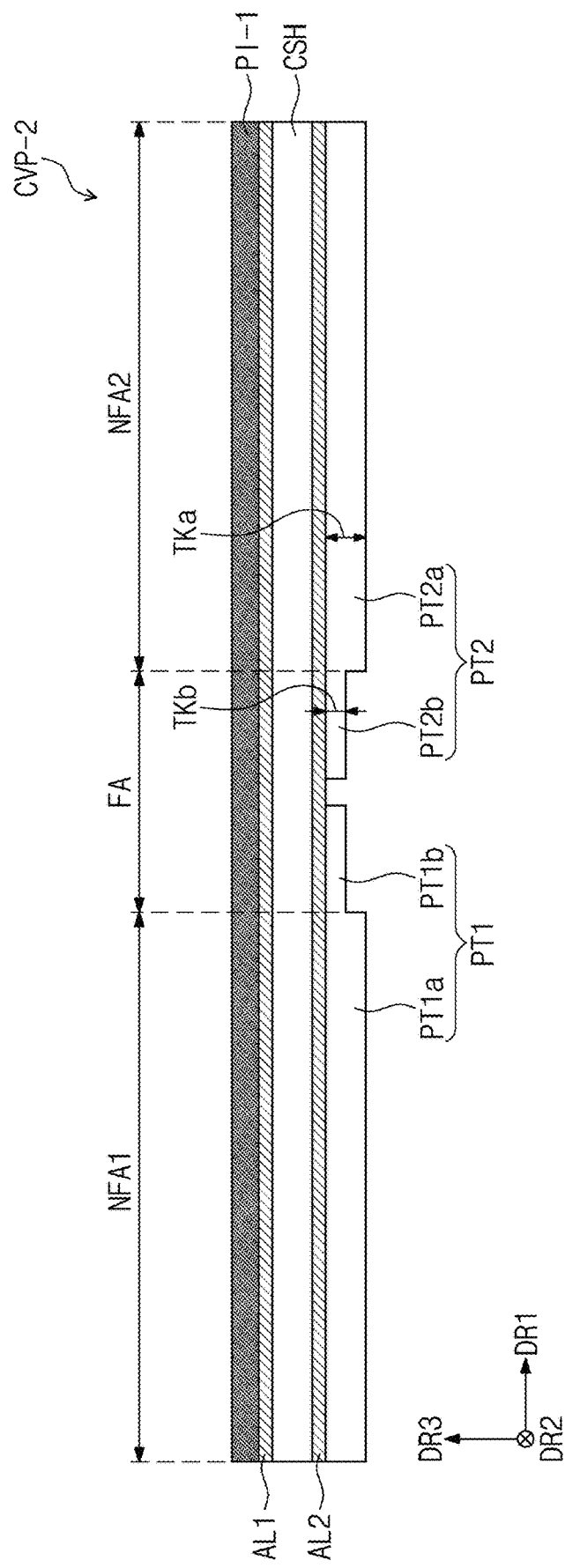

FIG. 7B is a cross-sectional view showing an exemplary embodiment of a cover member CVP-2 according to the invention.

In describing FIG. 7B, different features from FIG. 7A will be mainly described. In FIG. 7B, the same reference numerals denote the same elements in FIG. 7A, and thus details thereof will be omitted.

Referring to FIG. 7B, a protective layer PI-1 of the cover member CVP-2 may be a colored film having a predetermined color. In an exemplary embodiment, the colored film may be a film having a predetermined color, for example. The color may have a high light absorbance. That is, the color may have a low light transmittance. As an example, the color may be a gray color.

Figure 7C:
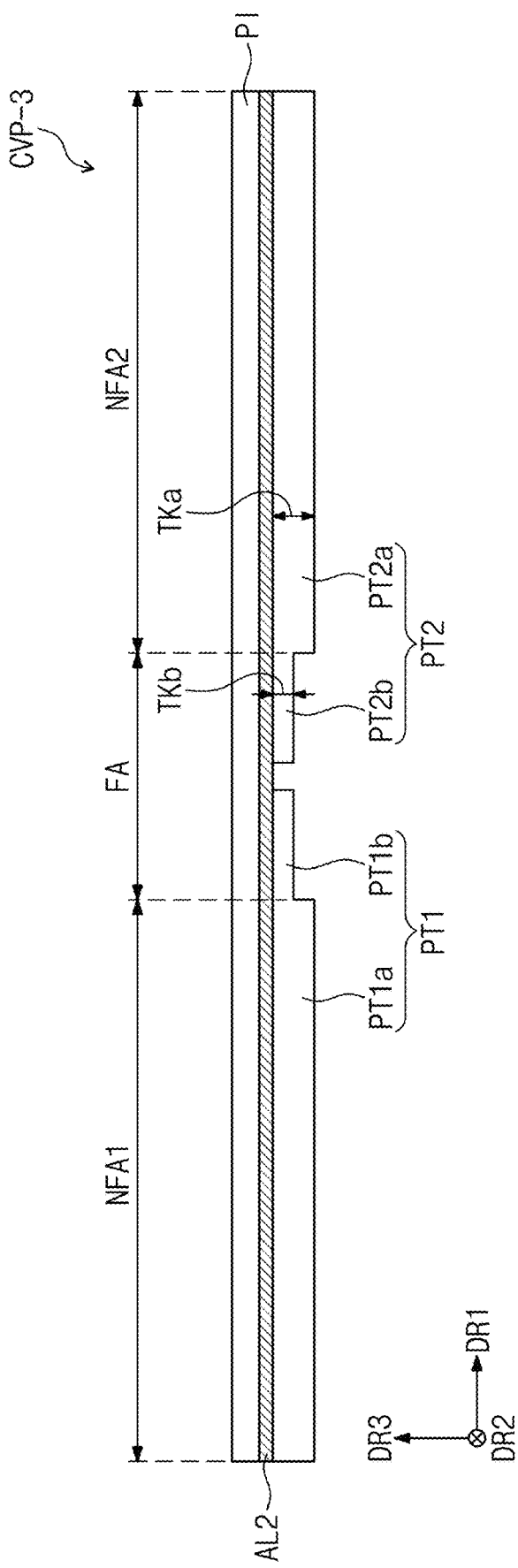

FIG. 7C is a cross-sectional view showing an exemplary embodiment of a cover member CVP-3 according to the invention. In describing FIG. 7C, different features from FIG. 7A will be mainly described. In FIG. 7C, the same reference numerals denote the same elements in FIG. 7A, and thus details thereof will be omitted.

Referring to FIG. 7C, the cushion layer CSH and the first adhesive layer AL1 may be omitted from the cover member CVP-3 as compared with the cover member CVP-1 of FIG. 7A. Accordingly, the thickness of the display device including the cover member CVP-3 may be thinner.

Figure 7D:
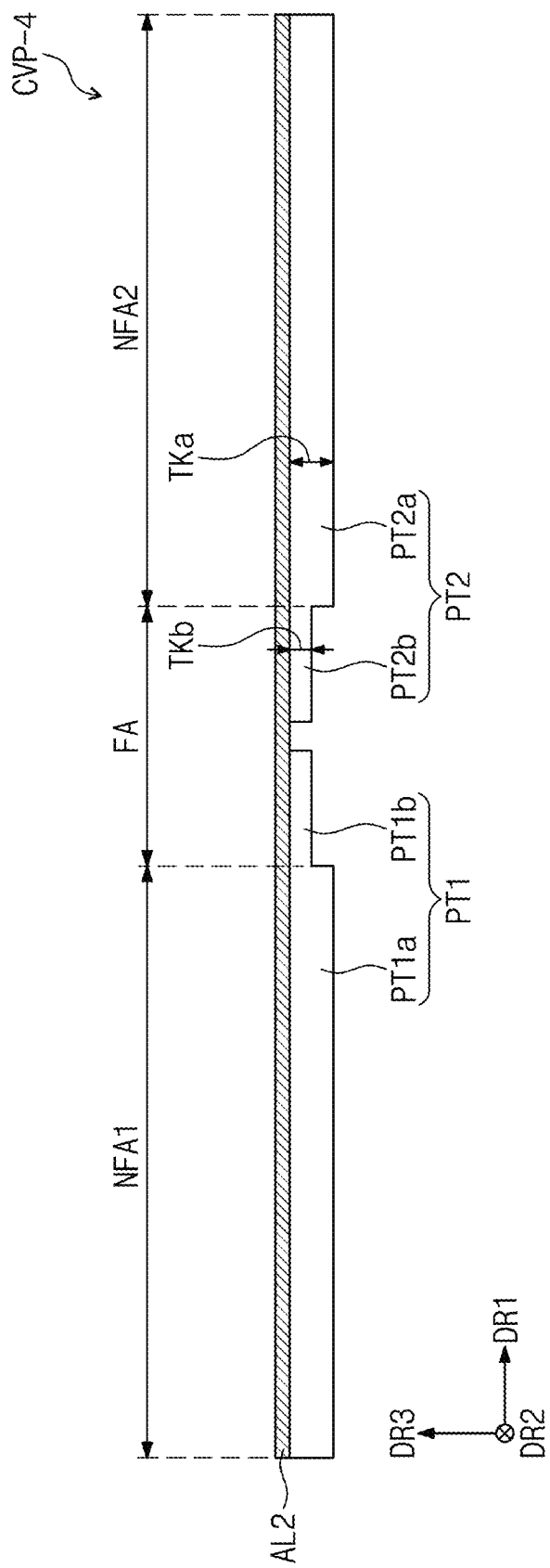

FIG. 7D is a cross-sectional view showing an exemplary embodiment of a cover member CVP-4 according to the invention. In describing FIG. 7D, different features from FIG. 7A will be mainly described. In FIG. 7D, the same reference numerals denote the same elements in FIG. 7A, and thus details thereof will be omitted.

Referring to FIG. 7D, the protective layer PI, the cushion layer CSH, and the first adhesive layer AL1 may be omitted from the cover member CVP-4 as compared with the cover member CVP-1 of FIG. 7A. Accordingly, the second adhesive layer AL2 may be directly attached to the rear surface of the display module DM (refer to FIG. 3). In this case, the adhesive layer AL shown in FIG. 3 may be omitted. Therefore, the thickness of the display device including the cover member CVP-4 may be thinner.

Figure 7E:
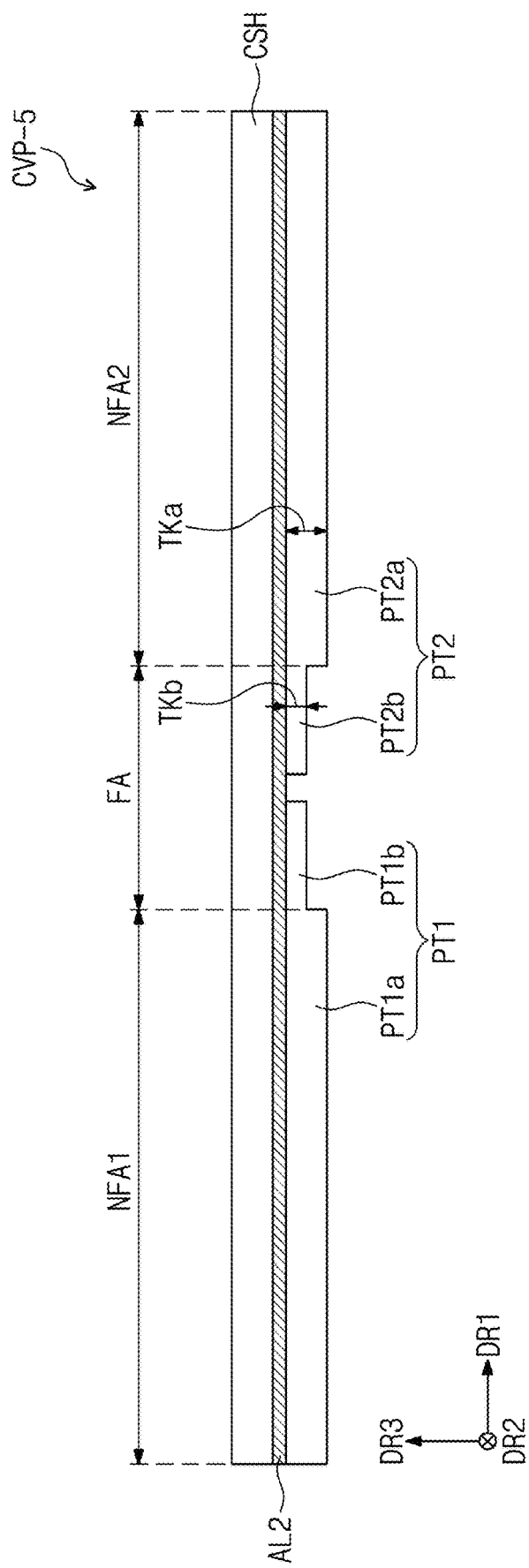

FIG. 7E is a cross-sectional view showing an exemplary embodiment of a cover member CVP-5 according to the invention. In describing FIG. 7E, different features from FIG. 7A will be mainly described. In FIG. 7E, the same reference numerals denote the same elements in FIG. 7A, and thus details thereof will be omitted.

Referring to FIG. 7E, the first adhesive layer AL1 and the protective layer PI may be omitted from the cover member CVP-5 as compared with the cover member CVP-1 of FIG. 7A. The cushion layer CSH may be directly attached to the adhesive layer AL shown in FIG. 3. Therefore, the thickness of the display device including the cover member CVP-5 may be thinner.

Figure 8A:
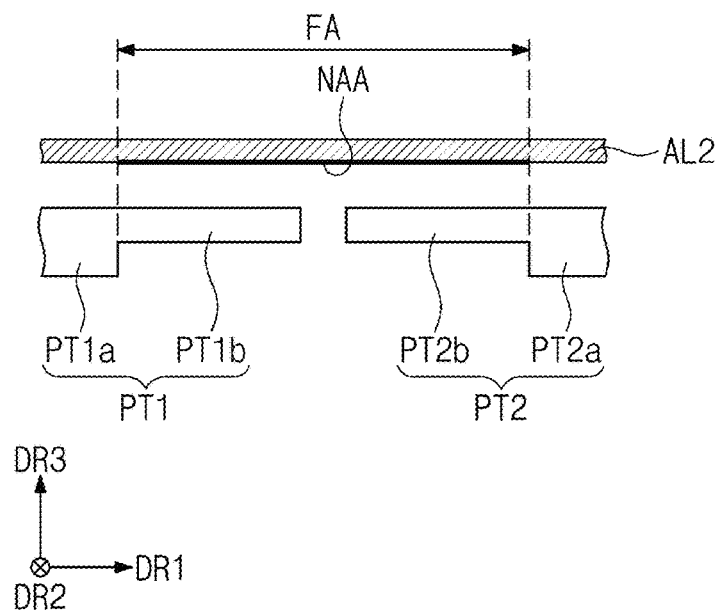
FIGS. 8A and 8B are enlarged exploded cross-sectional views showing an exemplary embodiment of some components of a cover member according to the invention.

FIG. 8A is an enlarged exploded cross-sectional view showing an exemplary embodiment of components of a cover member according to the invention.

Referring to FIG. 8A, the second adhesive layer AL2 that overlaps with the folding area FA may not be attached to the first plate PT1 and the second plate PT2. In an exemplary embodiment, an adhesive force of some portions of the second adhesive layer AL2, which face the first protrusion portion PT1*b* and the second protrusion portion PT2*b*, may be lower than an adhesive force of the other portions of the second adhesive layer AL2, which face the first support portion PT1*a* and the second support portion PT2*a*, for example. As an example, the adhesive force of the some portions of the second adhesive layer AL2 may be removed by irradiating an ultraviolet ray to the some portions of the second adhesive layer AL2. FIG. 8A shows an area NAA where the adhesive force is lowered or removed.

Figure 8B:
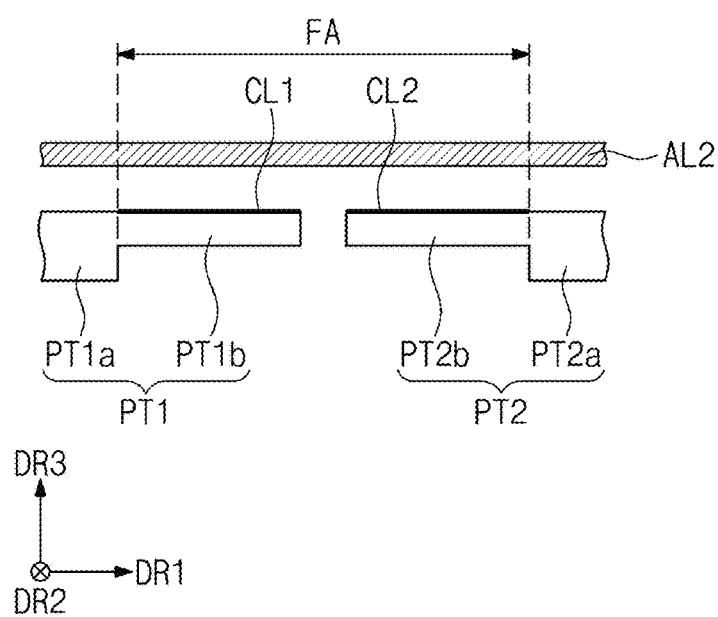

FIG. 8B is an enlarged exploded cross-sectional view showing an exemplary embodiment of some components of a cover member according to the invention.

Referring to FIG. 8B, a first coating layer CL1 may be disposed on the first protrusion portion PT1*b*, and a second coating layer CL2 may be disposed on the second protrusion portion PT2*b*. The first and second coating layers CL1 and CL2 may include fluorine. The first and second coating layers CL1 and CL2 may not be attached to the second adhesive layer AL2.

Figure 9:
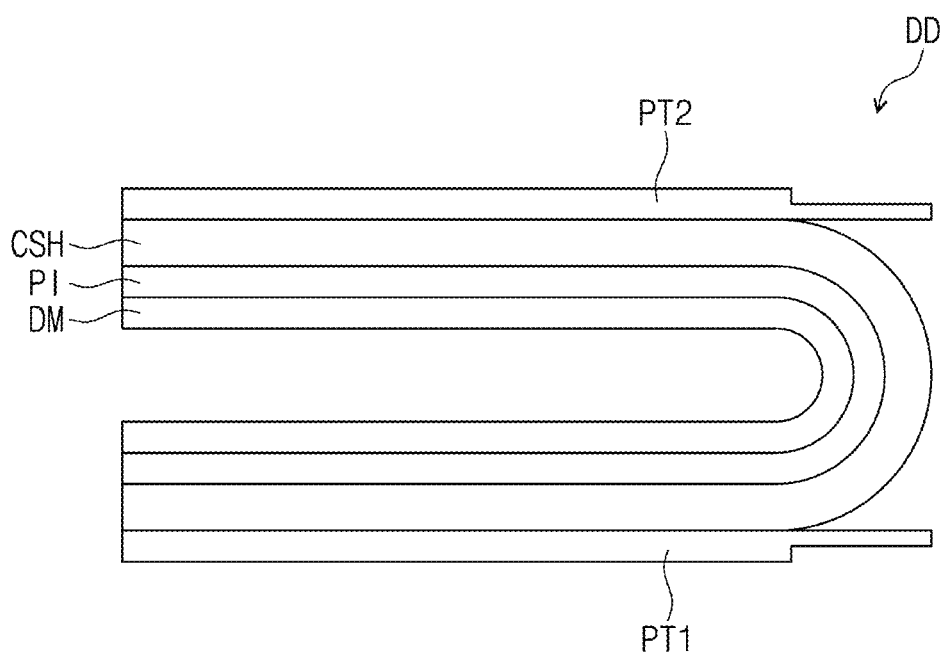
FIG. 9 is a cross-sectional view showing an exemplary embodiment of a folded state of a display device according to the invention.

FIG. 9 is a cross-sectional view showing an exemplary embodiment of a folded state of a display device DD according to the invention. FIG. 9 is a cross-sectional view showing a first state of the folded display device DD.

FIG. 9 shows a display module DM, a protective layer PI, a cushion layer CSH, a first plate PT1, and a second plate PT2.

When the display device DD is folded, the display module DM, the protective layer PI, and the cushion layer CSH may be folded, and the first plate PT1 and the second plate PT2 may not be folded. In an exemplary embodiment, a portion of the first plate PT1 overlapping with the folding area FA (refer to FIG. 1B) may be spaced apart from the cushion layer CSH, and a portion of the second plate PT2 overlapping with the folding area FA may be spaced apart from the cushion layer CSH, for example.

Figure 10A:
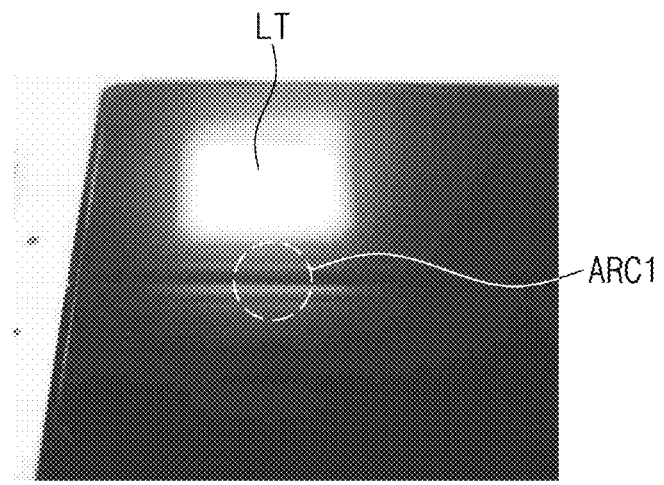
FIG. 10A is an image obtained by photographing a comparison embodiment of a display device.
Figure 10B:
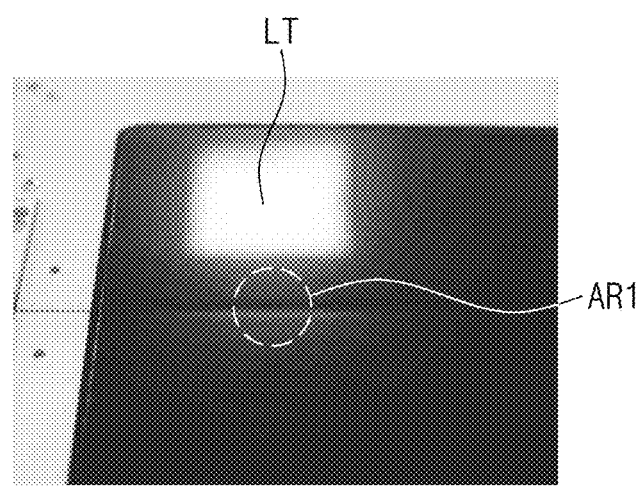
FIG. 10B is an image obtained by photographing an exemplary embodiment of a display device according to the invention.

FIG. 10A is an image obtained by photographing a display device according to a comparison embodiment. FIG. 10B is an image obtained by photographing an exemplary embodiment of a display device according to the invention.

In detail, FIG. 10A is the image obtained by photographing the display device in which the thickness of the first protrusion portion is substantially the same as the thickness of the first support portion and the thickness of the second protrusion portion is substantially the same as the thickness of the second support portion, and FIG. 10B is the image obtained by photographing the display device including the cover member CVP-1 shown in FIG. 7A. An evaluation on the visibility of the flexural deformation may be carried out using a lighting LT.

In the exemplary embodiment of the invention, since the space in which the display module DM is accommodated is defined in the rear surface of the display module DM (refer to FIG. 3), the protruding deformation of the display module DM may be reduced. As a result, a degree of visibility of the flexural deformation may be reduced. When comparing a first comparison area ARC1 of FIG. 10A with a first area AR1 of FIG. 10B, it may be confirmed that the flexural deformation is more easily recognized in the first comparison area ARC1.

Figure 11:
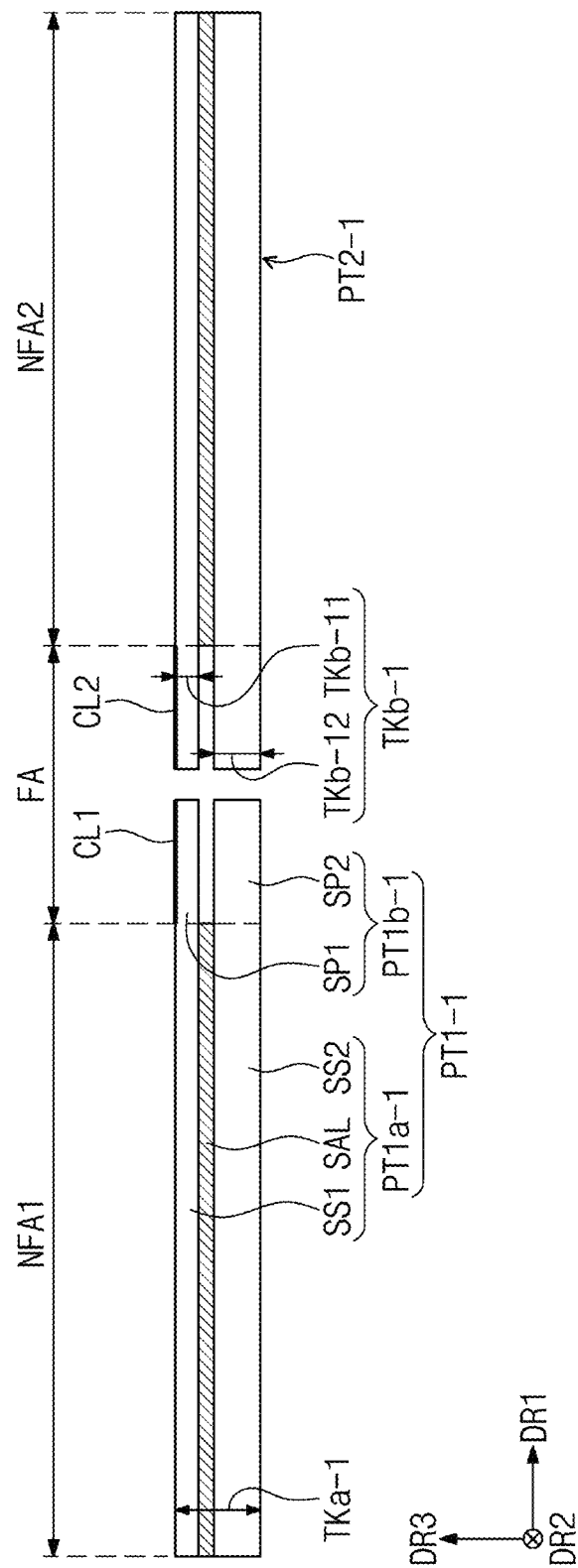
FIG. 11 is a cross-sectional view showing an exemplary embodiment of a first plate and a second plate according to the invention.

FIG. 11 is a cross-sectional view showing an exemplary embodiment of a first plate PT1-1 and a second plate PT2-1 according to the invention. Hereinafter, the first plate PT1-1 and the second plate PT2-1 described with reference to FIGS. 11 to 13 may be applied as the first plate PT1 and the second plate PT2 described with reference to FIGS. 7A to 7E.

Referring to FIG. 11, each of the first plate PT1-1 and the second plate PT2-1 may have a cantilever structure in the folding area FA. Hereinafter, the first plate PT1-1 will be described in detail. Since the second plate PT2-1 has substantially the same structure as that of the first plate PT1-1, detailed descriptions on the second plate PT2-1 will be omitted.

The first plate PT1-1 may include a first support portion PT1*a*-1 and a first protrusion portion PT1*b*-1. The first support portion PT1*a*-1 may include a first sub-support portion SS1, a sub-adhesive layer SAL, and a second sub-support portion SS2. The first protrusion portion PT1*b*-1 may include a first sub-protrusion portion SP1 and a second sub-protrusion portion SP2.

The first sub-support portion SS1 may be disposed under the display module DM (refer to FIG. 3). The sub-adhesive layer SAL may be attached to a lower portion of the first sub-support portion SS1. The second sub-support portion SS2 may be attached to a lower portion of the sub-adhesive layer SAL. The first sub-support portion SS1 may have a thickness equal to or greater than a thickness of the second sub-support portion SS2.

The first sub-protrusion portion SP1 may extend from the first sub-support portion SS1, and the first sub-support portion SS1 and the first sub-protrusion portion SP1 may be unitary. The second sub-protrusion portion SP2 may extend from the second sub-support portion SS2, and the second sub-support portion SS2 and the second sub-protrusion portion SP2 may be unitary.

The first support portion PT1*a*-1 may have a thickness TKa-1 corresponding to a sum of thicknesses of the first sub-support portion SS1, the sub-adhesive layer SAL, and the second sub-support portion SS2. The first protrusion portion PT1*b*-1 may have a thickness TKb-1 corresponding to a sum of a thickness TKb-11 of the first sub-protrusion portion SP1 and a thickness TKb-12 of the second sub-protrusion portion SP2. In this case, since the first protrusion portion PT1*b*-1 does not include the sub-adhesive layer SAL as compared with the first support portion PT1*a*-1, the first protrusion portion PT1*b*-1 may have a thickness smaller than that of the first support portion PT1*a*-1.

The first sub-protrusion portion SP1 may be easily deformed due to an empty space between the first sub-protrusion portion SP1 and the second sub-protrusion portion SP2. In an exemplary embodiment, when the flexural deformation occurs in the display module DM (refer to FIG. 3), the first sub-protrusion portion SP1 may be bent toward the second sub-protrusion portion SP2 due to the deformation of the display module DM, for example.

Accordingly, a space may be provided between the display module DM and the first sub-protrusion portion SP1 so that the portion of the display module DM may be sagged in the space, and a degree of protrusion of the display module DM may be reduced. Thus, the flexural deformation of the display module DM may be prevented from being recognized by the user.

Figure 12:
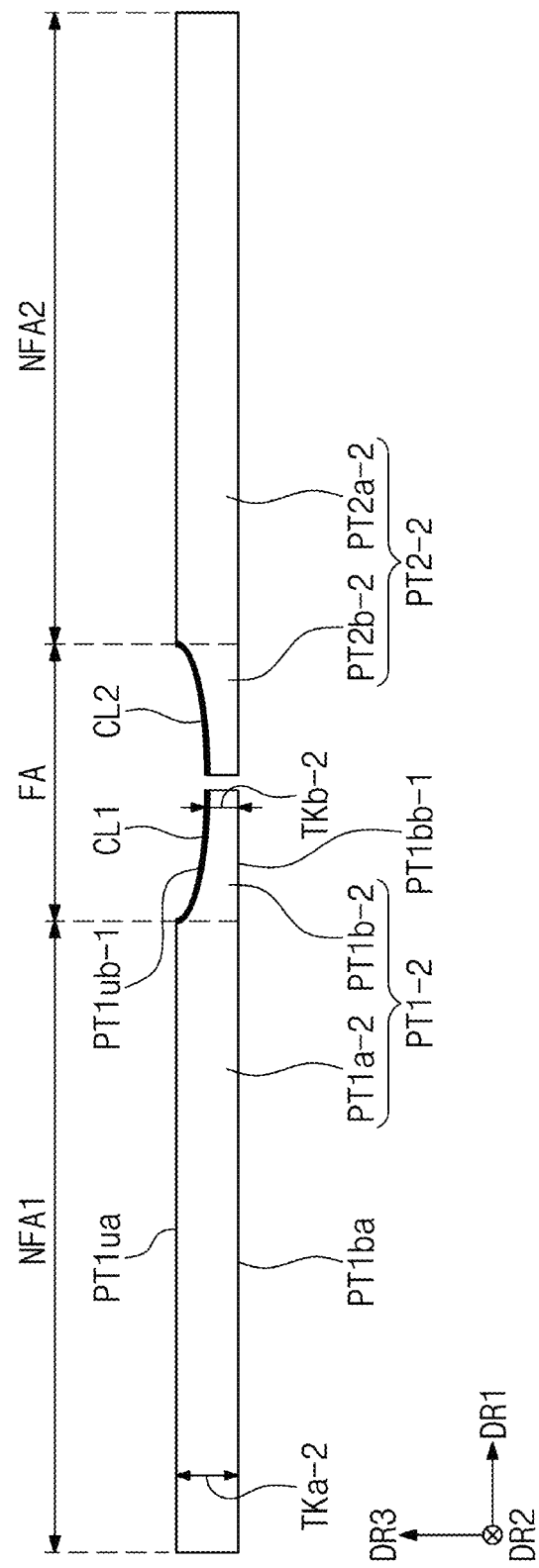
FIG. 12 is a cross-sectional view showing an exemplary embodiment of a first plate and a second plate according to the invention.

FIG. 12 is a cross-sectional view showing an exemplary embodiment of a first plate PT1-2 and a second plate PT2-2 according to the invention.

Referring to FIG. 12, a thickness of the first plate PT1-2 in an area that overlaps with the folding area FA may be different from a thickness of the first plate PT1-2 in an area that overlaps with the first non-folding area NFA1, and a thickness of the second plate PT2-2 in an area that overlaps with the folding area FA may be different from a thickness of the second plate PT2-2 in an area that overlaps with the second non-folding area NFA2.

The first plate PT1-2 may include a first support portion PT1a-2 and a first protrusion portion PT1b-2 protruding from the first support portion PT1a-2 toward the second plate PT2-2. The second plate PT2-2 may include a second support portion PT2a-2 and a second protrusion portion PT2b-2 protruding from the second support portion PT2a-2 toward the first plate PT1-2.

A first coating layer CL1 may be disposed on the first protrusion portion PT1b-2, and a second coating layer CL2 may be disposed on the second protrusion portion PT2b-2. In another exemplary embodiment of the invention, the first coating layer CL1 and the second coating layer CL2 may be omitted.

Hereinafter, the structure of the first plate PT1-2 will be described in detail, and descriptions on the second plate PT2-2 will be omitted. Since the second plate PT2-2 has substantially the same structure as the first plate PT1-2, the second plate PT2-2 refers to the description of the first plate PT1-2.

An upper surface PT1ub-1 of the first protrusion portion PT1b-2 may have a curvature. That is, the upper surface PT1ub-1 may have a curved shape. The upper surface PT1ub-1 may have a shape concavely recessed from an upper surface PT1ua of the first support portion PT1a-2. A lower surface PT1bb-1 of the first protrusion portion PT1b-2 may face the upper surface PT1ub-1 and may be flat. A thickness TKb-2 of the first protrusion portion PT1b-2 may correspond to a distance between the upper surface PT1ub-1 and the lower surface PT1bb-1. Accordingly, the thickness TKb-2 may differ depending on its position in the first protrusion portion PT1b-2. The thickness TKb-2 may decrease as a distance from the first support portion PT1a-2 increases.

In the exemplary embodiment of the invention, a space in which the display module DM (refer to FIG. 3) is accommodated may be provided in the rear surface of the display module DM by the shape of the first protrusion portion PT1b-2 and the second protrusion portion PT2b-2. Accordingly, when the deformation in shape occurs in the display module DM, the protruding deformation on the upper surface of the display module DM may be reduced. As a result, a degree of visibility of the flexural deformation may be reduced.

In an exemplary embodiment, a difference between a minimum thickness of the thickness TKb-2 of the first protrusion portion PT1b-2 and the thickness TKa-2 of the first support portion PT1a-2 may be within a range equal to or greater than about 5 micrometers and equal to or smaller than about 50 micrometers, for example. As an example, when the difference is smaller than about 5 micrometers, an effect of easing the deformation of the shape of the display module DM may be reduced. In addition, when the difference is greater than about 50 micrometers, the folding area FA of the display module DM may not be sufficiently supported by the first plate PT1-2 and the second plate PT2-2 in the unfolded state.

Figure 13:
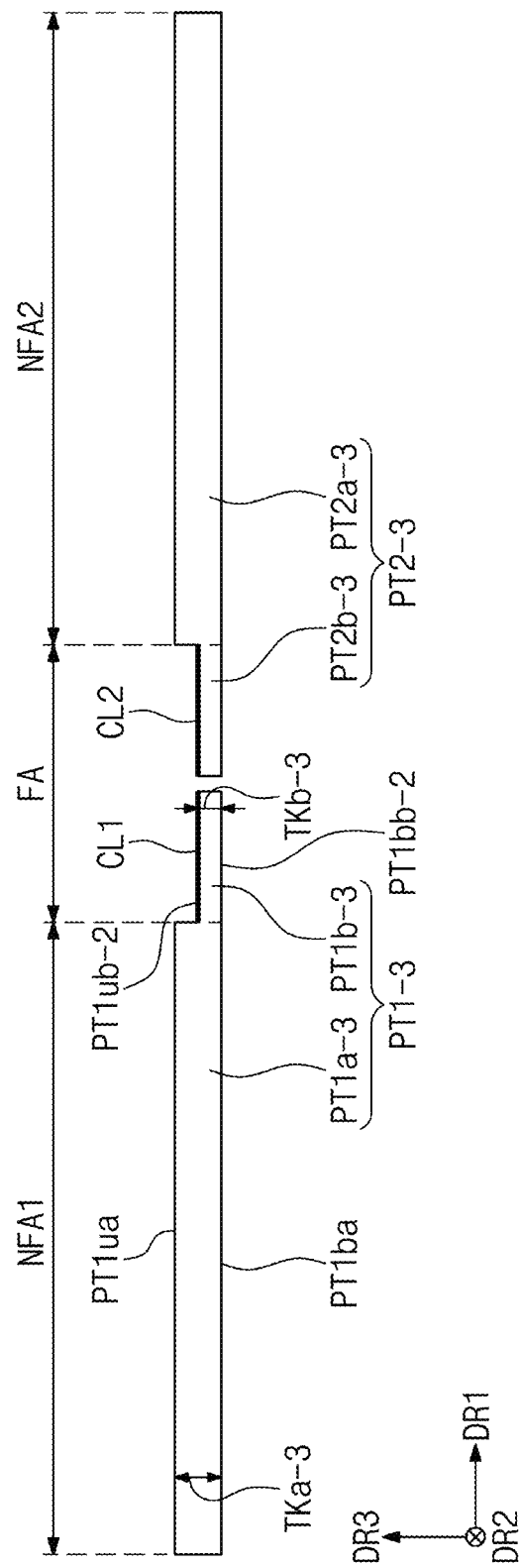
FIG. 13 is a cross-sectional view showing an exemplary embodiment of a first plate and a second plate according to the invention.

FIG. 13 is a cross-sectional view showing an exemplary embodiment of a first plate PT1-3 and a second plate PT2-3 according to the invention.

Referring to FIG. 13, a thickness of the first plate PT1-3 in an area that overlaps with the folding area FA may be different from a thickness of the first plate PT1-3 in an area that overlaps with the first non-folding area NFA1, and a thickness of the second plate PT2-3 in an area that overlaps with the folding area FA may be different from a thickness of the second plate PT2-3 in an area that overlaps with the second non-folding area NFA2.

The first plate PT1-3 may include a first support portion PT1a-3 and a first protrusion portion PT1b-3 protruding from the first support portion PT1a-3 toward the second plate PT2-3. The second plate PT2-3 may include a second support portion PT2a-3 and a second protrusion portion PT2b-3 protruding from the second support portion PT2a-3 toward the first plate PT1-3.

A first coating layer CL1 may be disposed on the first protrusion portion PT1b-3, and a second coating layer CL2 may be disposed on the second protrusion portion PT2b-3. In another exemplary embodiment of the invention, the first coating layer CL1 and the second coating layer CL2 may be omitted.

Hereinafter, the structure of the first plate PT1-3 will be described in detail, and descriptions on the second plate PT2-3 will be omitted.

An upper surface PT1ub-2 of the first protrusion portion PT1b-3 may be flat. The upper surface PT1ub-2 may have a shape recessed from an upper surface PT1ua of the first support portion PT1a-3. A lower surface PT1bb-2 of the first protrusion portion PT1b-3 may face the upper surface PT1ub-2 and may be flat.

According the exemplary embodiment of the invention, a thickness Tkb-3 of the first protrusion portion PT1b-3 may be smaller than a thickness TKa-3 of the first support portion PT1a-3. In an exemplary embodiment, a difference between the thickness Tkb-3 of the first protrusion portion PT1b-3 and the thickness TKa-3 of the first support portion PT1a-3 may be within a range equal to or greater than about 5 micrometers and equal to or smaller than about 50 micrometers, for example, however, it should not be limited thereto or thereby.

In the exemplary embodiment of the invention, a space in which the display module DM (refer to FIG. 3) is accommodated may be provided in the rear surface of the display module DM by the shape of the first protrusion portion PT1b-3 and the second protrusion portion PT2b-3. Accordingly, when the deformation in shape occurs in the display module DM, the protruding deformation on the upper surface of the display module DM may be reduced. As a result, a degree of visibility of the flexural deformation may be reduced.

Although the exemplary embodiments of the invention have been described, it is understood that the invention should not be limited to these exemplary embodiments but various changes and modifications may be made by one ordinary skilled in the art within the spirit and scope of the invention as hereinafter claimed. Therefore, the disclosed subject matter should not be limited to any single embodiment described herein, and the scope of the invention shall be determined according to the attached claims.

What is claimed is:

1. A display device comprising:
a display module comprising a first non-folding area, a folding area, and a second non-folding area sequentially defined along a first direction; and
a cover member disposed under the display module, the cover member comprising:
a first plate comprising a first support portion disposed under the first non-folding area and a first protrusion portion disposed under the folding area; and
a second plate comprising a second support portion disposed under the second non-folding area and a second protrusion portion disposed under the folding area,
wherein a thickness of the first protrusion portion is smaller than a thickness of the first support portion, and a thickness of the second protrusion portion is smaller than a thickness of the second support portion.

2. The display device of claim 1, wherein the thickness of the first protrusion portion and the thickness of the second protrusion portion are uniform.

3. The display device of claim 1, wherein the thickness of the first protrusion portion decreases as a distance from the first support portion increases, and the thickness of the second protrusion portion decreases as a distance from the second support portion increases.

4. The display device of claim 1, wherein an upper surface of the first protrusion portion and an upper surface of the second protrusion portion have a curvature.

5. The display device of claim 1, wherein an upper surface of the first support portion and an upper surface of the first protrusion portion are disposed on a same plane, an upper surface of the second support portion and an upper surface of the second protrusion portion are disposed on a same plane, and the upper surface of the first support portion and the upper surface of the first protrusion portion face the display module.

6. The display device of claim 1, wherein a lower surface of the first support portion and a lower surface of the first protrusion portion are disposed on a same plane, and a lower surface of the second support portion and a lower surface of the second protrusion portion are disposed on a same plane.

7. The display device of claim 1, wherein the first support portion comprises:
a first sub-support portion disposed under the display module;
a sub-adhesive layer attached to a lower portion of the first sub-support portion; and
a second sub-support portion attached to a lower portion of the sub-adhesive layer.

8. The display device of claim 7, wherein the first protrusion portion comprises:
a first sub-protrusion portion disposed under the display module; and
a second sub-protrusion portion spaced apart from the first sub-protrusion portion.

9. The display device of claim 8, wherein the first sub-support portion and the first sub-protrusion portion are unitary with each other, and the second sub-support portion and the second sub-protrusion portion are unitary with each other.

10. The display device of claim 8, wherein a thickness of the first sub-support portion is smaller than a thickness of the second sub-support portion, and a thickness of the first sub-protrusion portion is smaller than a thickness of the second sub-protrusion portion.

11. The display device of claim 1, wherein the cover member further comprises an adhesive layer disposed between the first plate and the display module and between the second plate and the display module, and the adhesive layer is attached to the first support portion and the second support portion and not attached to the first protrusion portion and the second protrusion portion.

12. The display device of claim 11, wherein the cover member further comprises a first coating layer disposed on the first protrusion portion and a second coating layer disposed on the second protrusion portion, and the first coating layer and the second coating layer are separated from the adhesive layer.

13. The display device of claim 11, wherein an adhesive force of a first portion of the adhesive layer, which faces the first protrusion portion and the second protrusion portion, is lower than an adhesive force of a second portion of the adhesive layer, which faces the first support portion and the second support portion.

14. The display device of claim 1, wherein at least one of the first plate and the second plate is a metal plate.

15. The display device of claim 1, wherein at least one of the first plate and the second plate is a plastic plate.

16. A display device comprising:
a display module which is transformable into a first state in which the display module is folded and into a second state in which the display module is unfolded; and
a cover member disposed under the display module, the cover member comprising:
an adhesive layer;
a first plate comprising a first support portion attached to a lower portion of the adhesive layer and a first protrusion portion extending from the first support portion; and
a second plate comprising a second support portion disposed under the lower portion of the adhesive layer and a second protrusion portion extending from the second support portion,
wherein the first protrusion portion and the second protrusion portion are spaced apart from the adhesive layer in the first state, a thickness of the first protrusion portion is smaller than a thickness of the first support portion, and a thickness of the second protrusion portion is smaller than a thickness of the second support portion.

17. The display device of claim 16, wherein the first protrusion portion and the second protrusion portion respectively comprise concave lower surfaces respectively recessed from a lower surface of the first support portion and a lower surface of the second support portion.

18. The display device of claim 16, wherein the first support portion comprises:
a first sub-support portion disposed under the display module;
a sub-adhesive layer attached to a lower portion of the first sub-support portion; and
a second sub-support portion attached to a lower portion of the sub-adhesive layer,
the first protrusion portion comprises:
a first sub-protrusion portion extending from the first sub-support portion; and
a second sub-protrusion portion extending from the second sub-support portion, and
the first sub-protrusion portion and the second sub-protrusion portion are spaced apart from each other.

19. The display device of claim 16, wherein the first protrusion portion and the second protrusion portion respectively comprise concave upper surfaces respectively recessed from an upper surface of the first support portion and an upper surface of the second support portion, the upper surface of the first support portion and the upper surface of the second support portion are attached to the adhesive layer.

20. The display device of claim 16, wherein the display module comprises a first non-folding area, a folding area, and a second non-folding area, which are sequentially defined in the display module, and the first protrusion portion and the second protrusion portion overlap with the folding area in the second state.

* * * * *